United States Patent

Thewes et al.

[19]

[11] Patent Number: 6,097,661
[45] Date of Patent: Aug. 1, 2000

[54] POINTER CIRCUIT WITH LOW SURFACE REQUIREMENT HIGH SPEED AND LOW POWER LOSS

[75] Inventors: Roland Thewes, Groebenzell; Doris Schmitt-Landsiedel, Ottobrunn; Paul-Werner von Basse, Wolfratshausen; Michael Bollu; Ute Kollmer, both of Munich; Andreas Luck, deceased, late of Munich; by Manfred Luck, legal representative; by Inge Booken, legal representative, both of Dortmund, all of Germany

[73] Assignee: Siemens Aktiengesellschaft, Munich, Germany

[21] Appl. No.: 09/161,004

[22] Filed: Sep. 25, 1998

[30] Foreign Application Priority Data

Sep. 26, 1997 [DE] Germany .................... 197 42 698

[51] Int. Cl.$^7$ ...................................................... G11C 7/00
[52] U.S. Cl. ............................ 365/230.03; 365/230.06; 365/189.05
[58] Field of Search ........................ 365/200, 230.03, 365/230.06, 185.09

[56] References Cited

U.S. PATENT DOCUMENTS 5,691,945  11/1997  Liou et al. ..................... 365/230.03

FOREIGN PATENT DOCUMENTS 0 738 974 A2   10/1996   European Pat. Off. .
0 784 866 B1   7/1997    European Pat. Off. .
44 37 581 C2   5/1996    Germany .

OTHER PUBLICATIONS

Neil H.E. Weste et al, Principles of CMOS VLSI Design, A Systems Perspective, Addison–Wesley Publishing Company, 1993, Second Edition, Chapter 8, pp. 560–579.

U. Tietze et al, Halbleiter–Schaltungstechnik, Springer–Verlag 9, Auflage, 1990, pp. 572–576.

*Primary Examiner*—Terrell W. Fears
*Attorney, Agent, or Firm*—Hill & Simpson

[57] ABSTRACT

In the pointer circuit, only one static memory (1) is respectively individually allocated to each output ( . . . , $A_{n-1}$, $A_n$, $A_{n+1}$, . . . ), of which each respectively has a pair of mutually complementary memory terminals (Q, $\bar{Q}$). The two terminals are in two stored logical states ("1," "0") differing from one another. A memory terminal (Q) of each memory is connected with the output allocated to this memory. The memories are controlled by clock signals. This results in advantageous surface requirement and power loss low, as well as high speed.

11 Claims, 25 Drawing Sheets

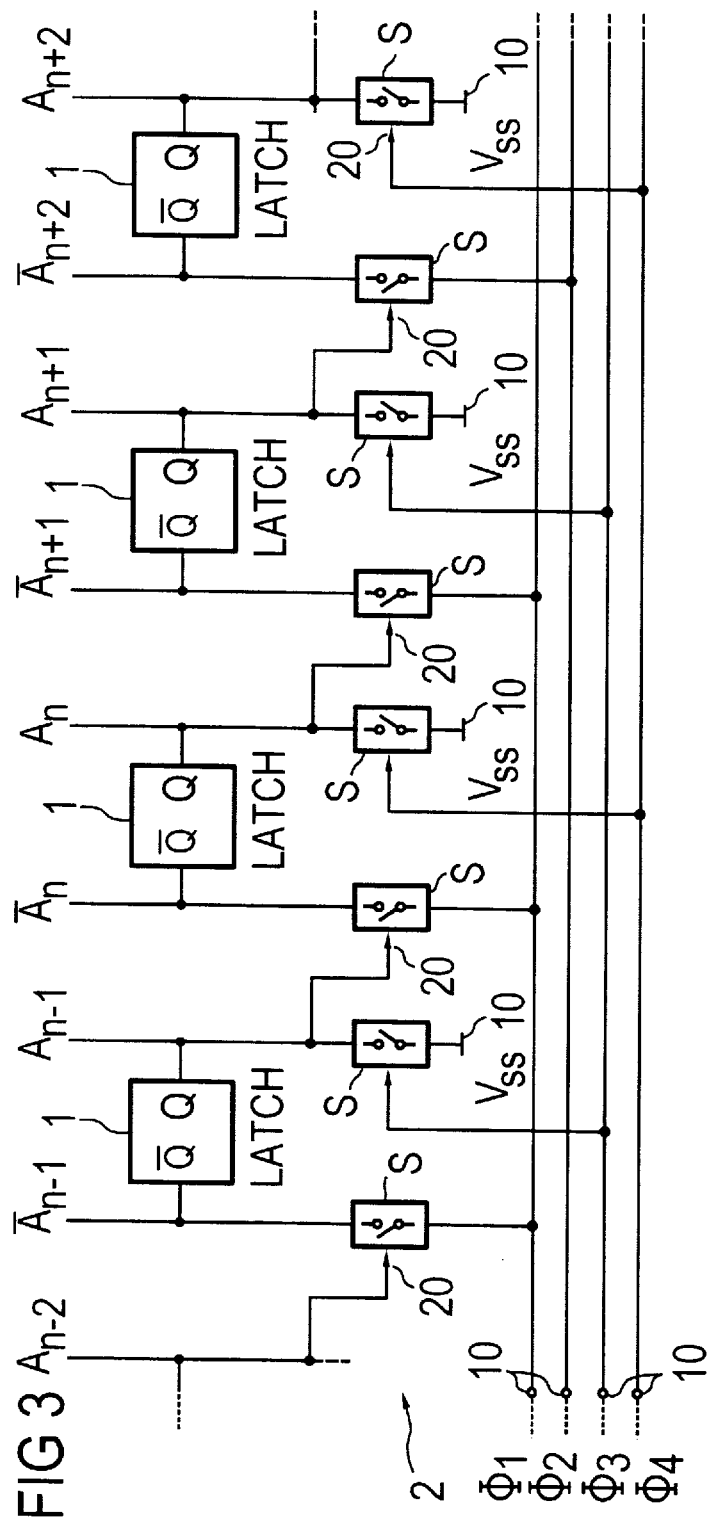
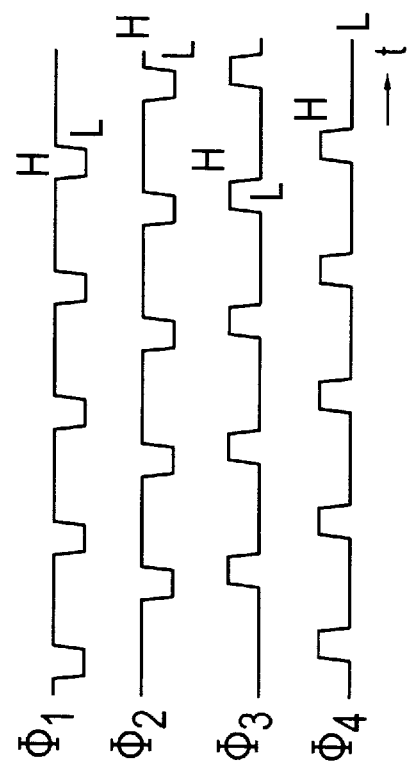
FIG 3
FIG 3a

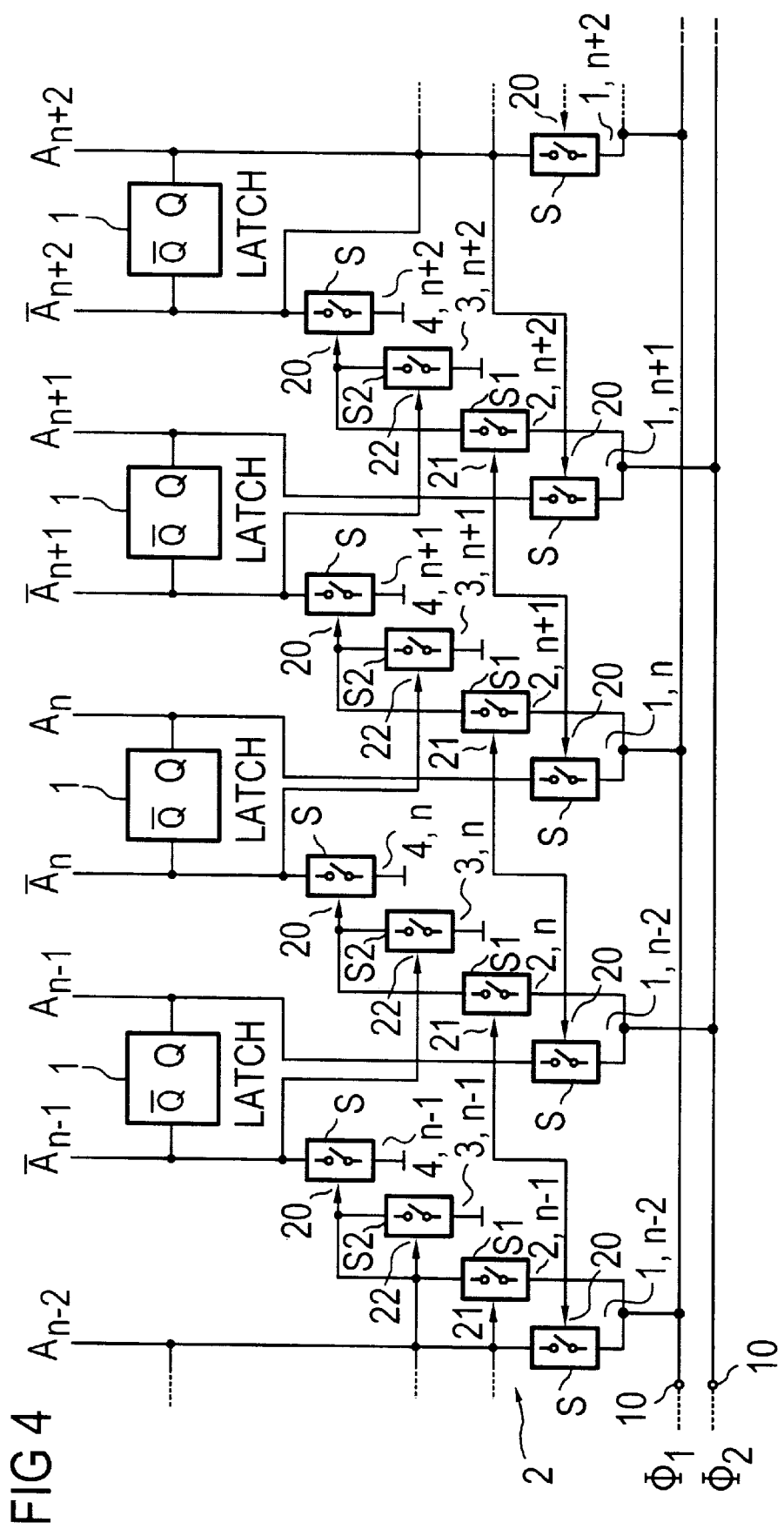

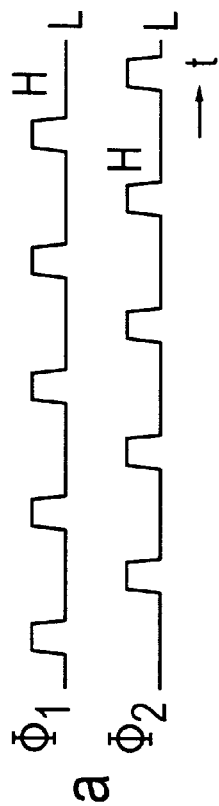

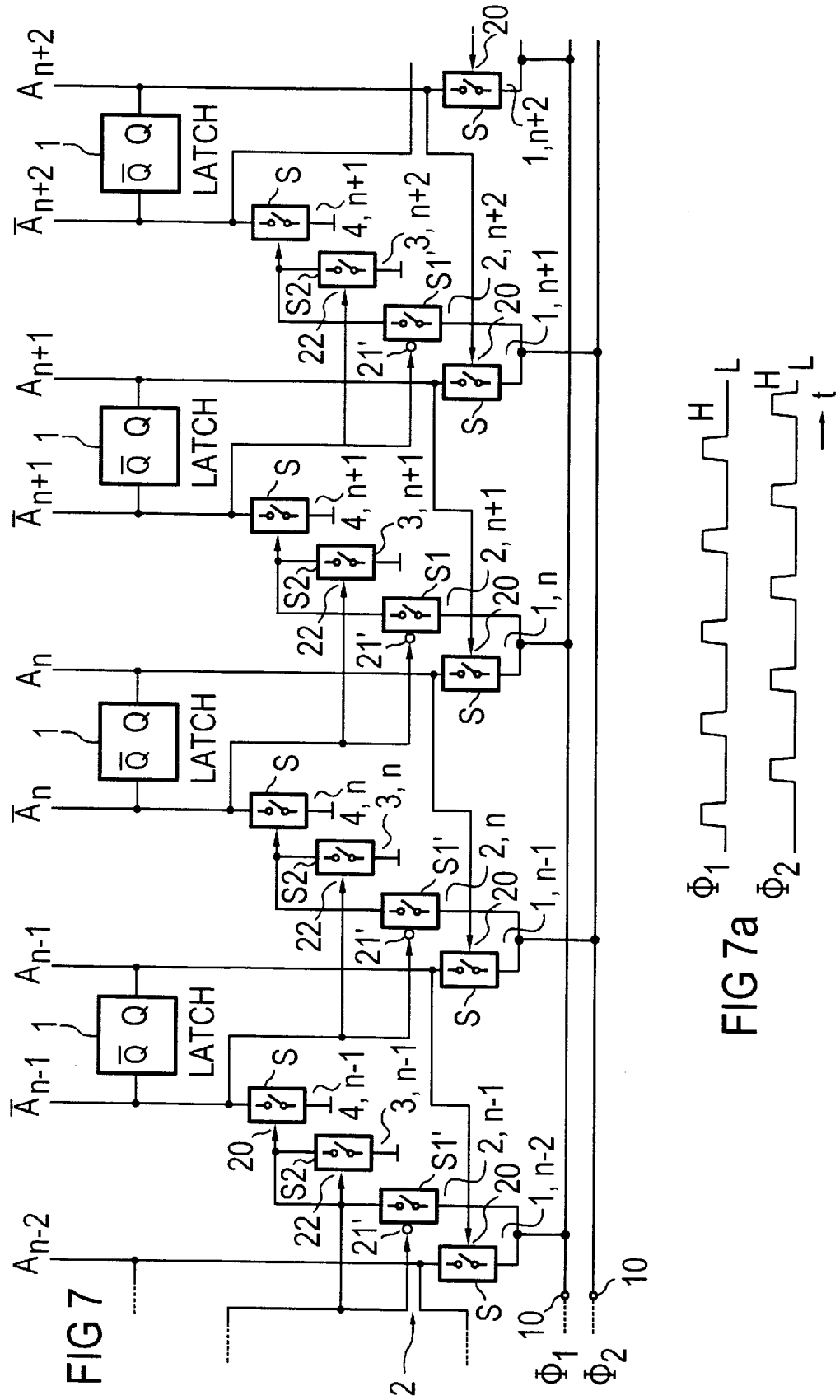

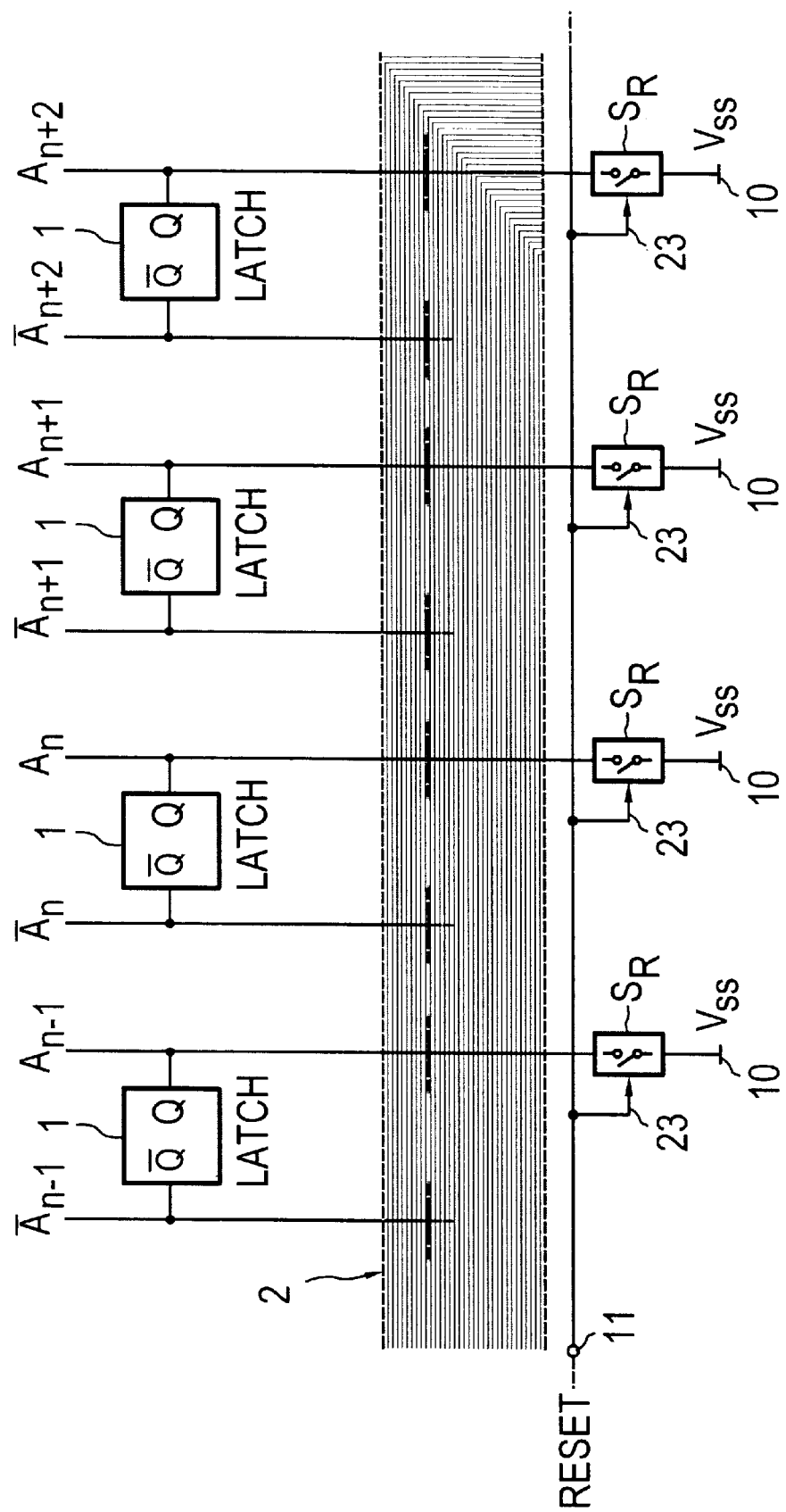

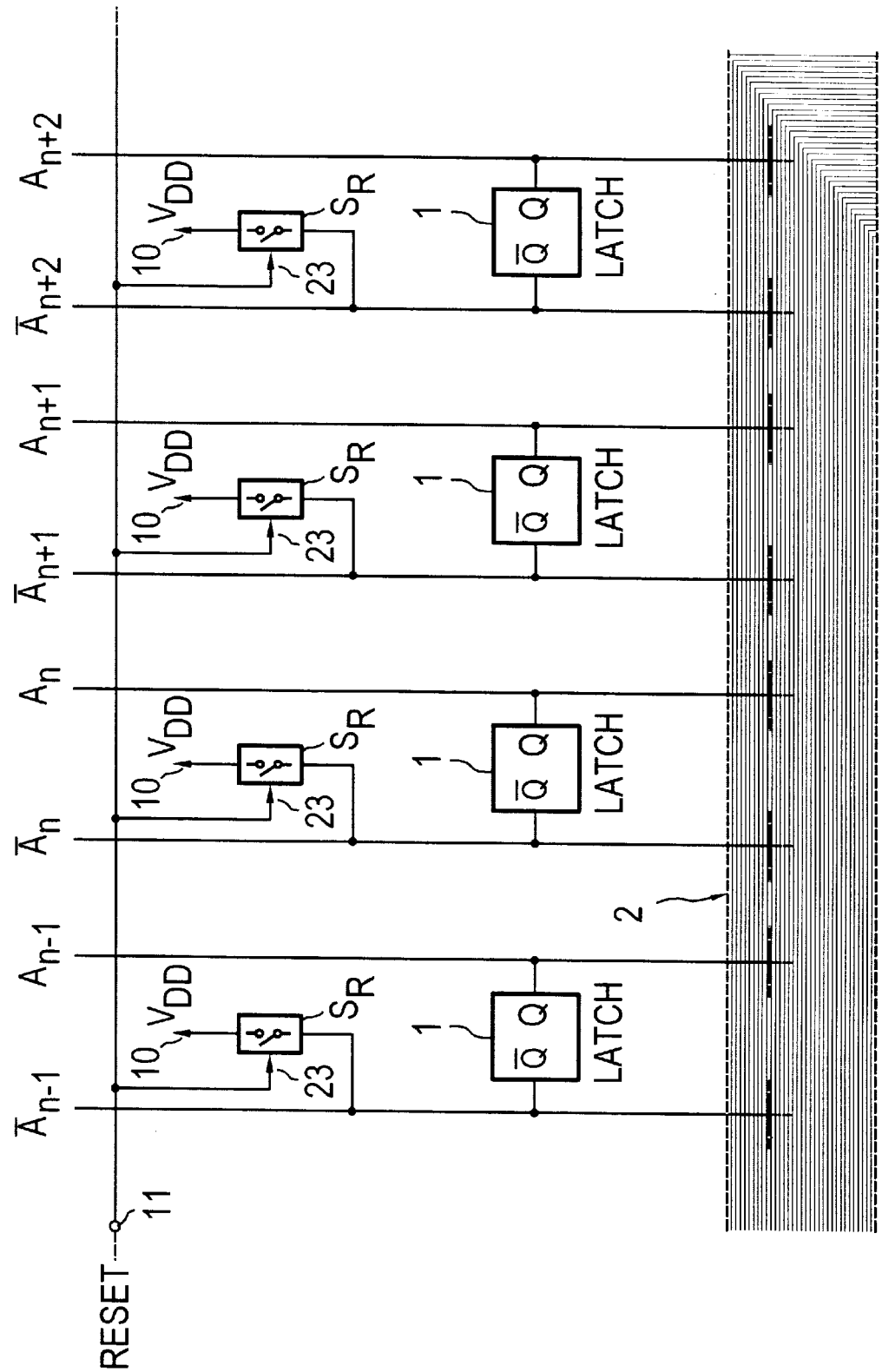

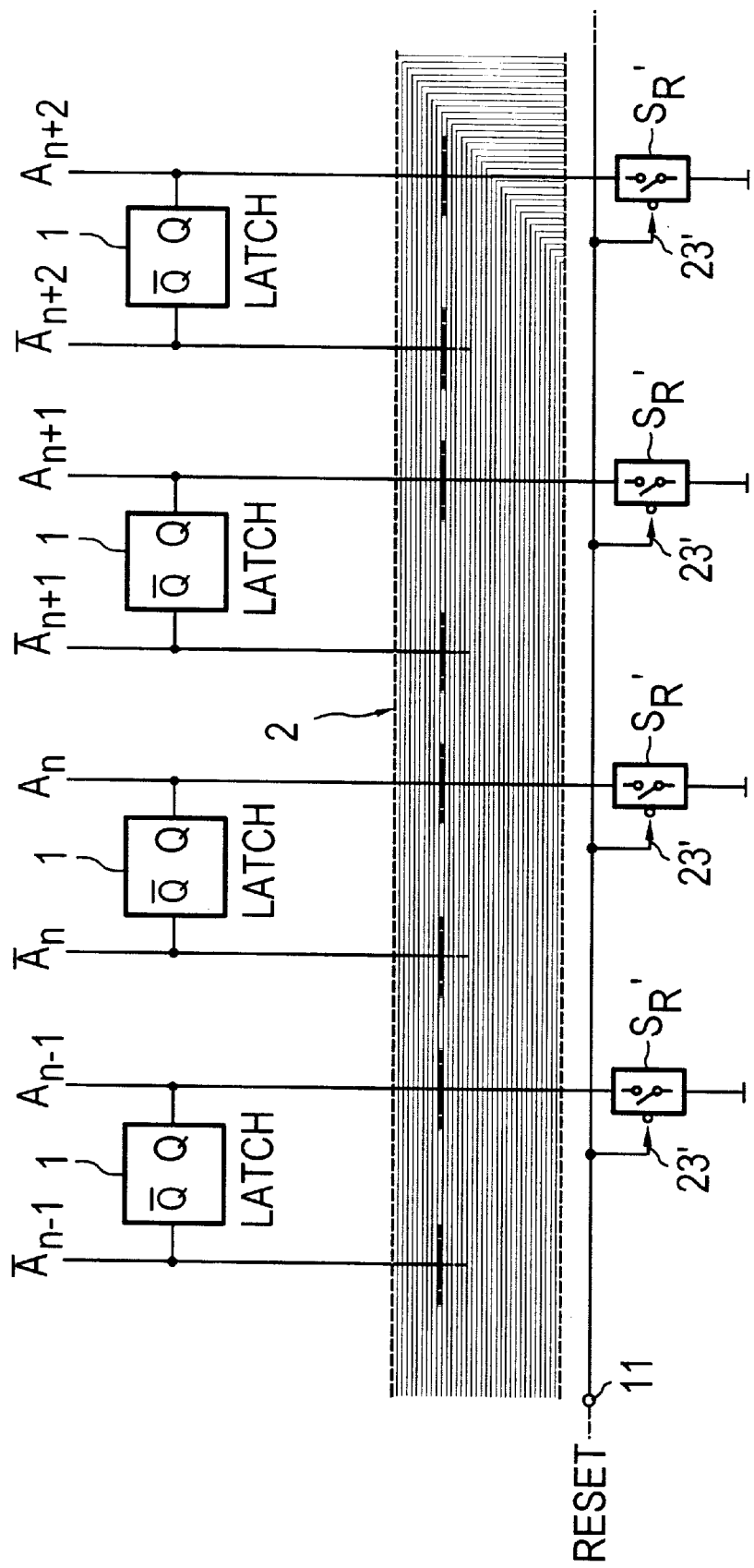

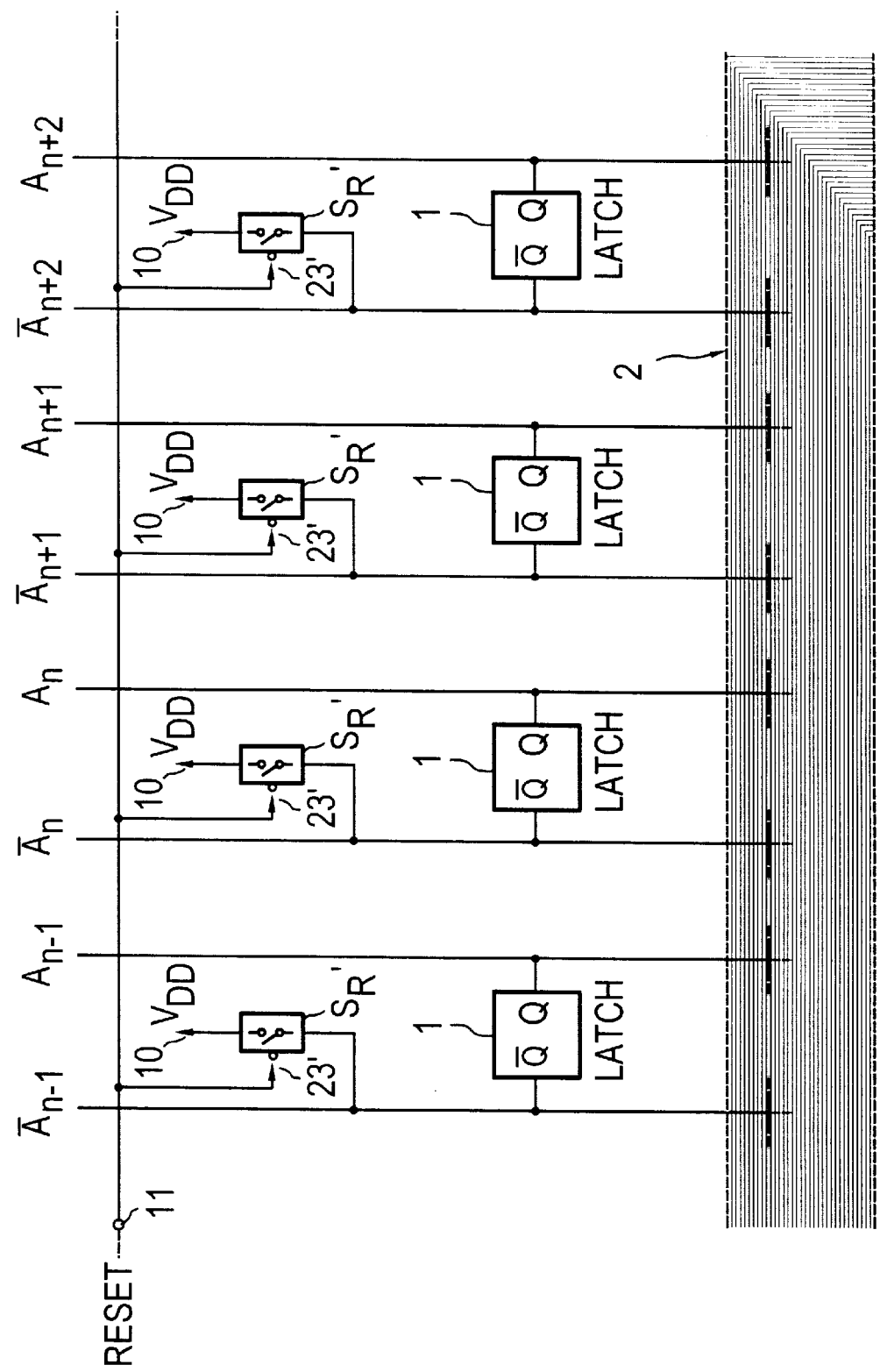

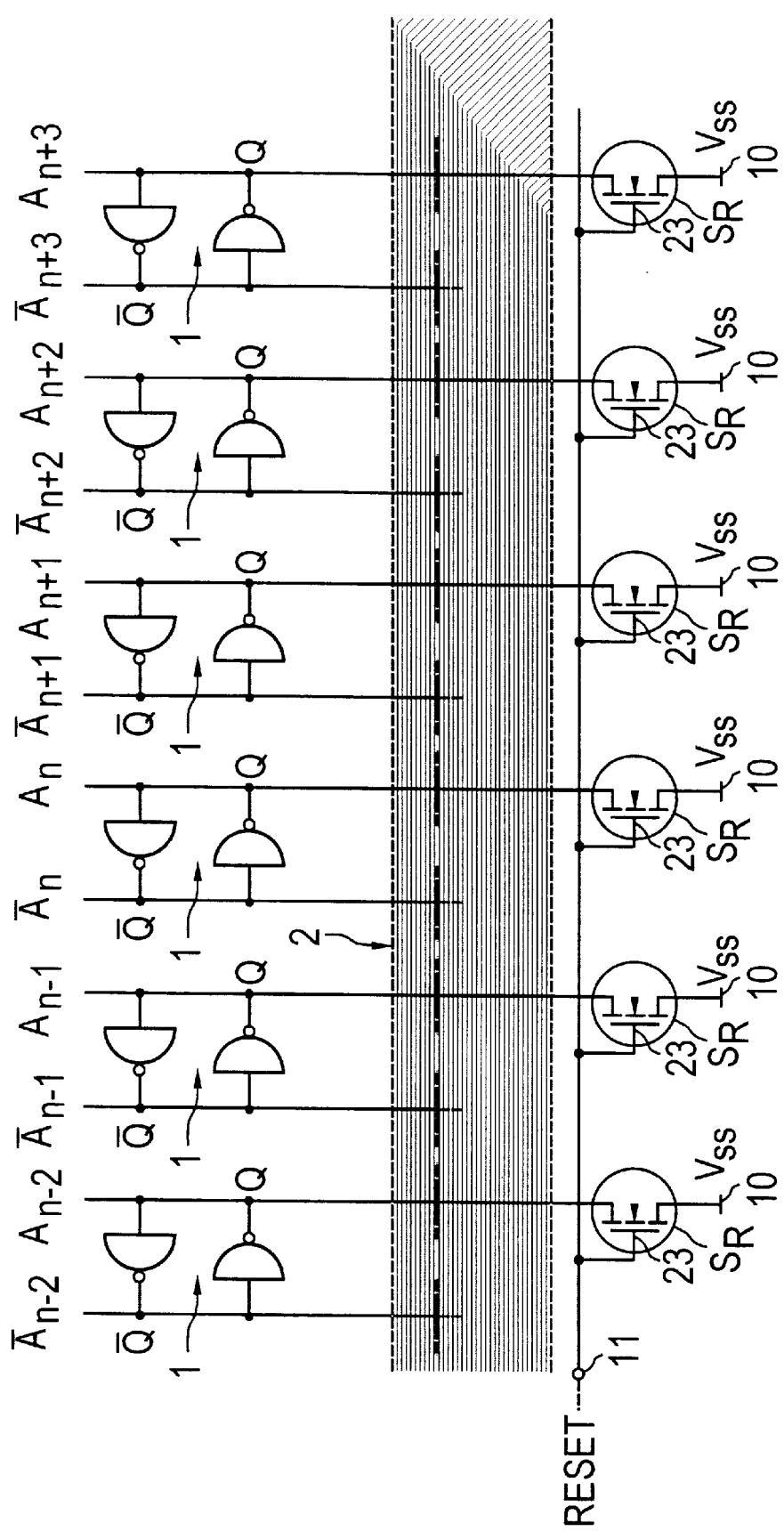

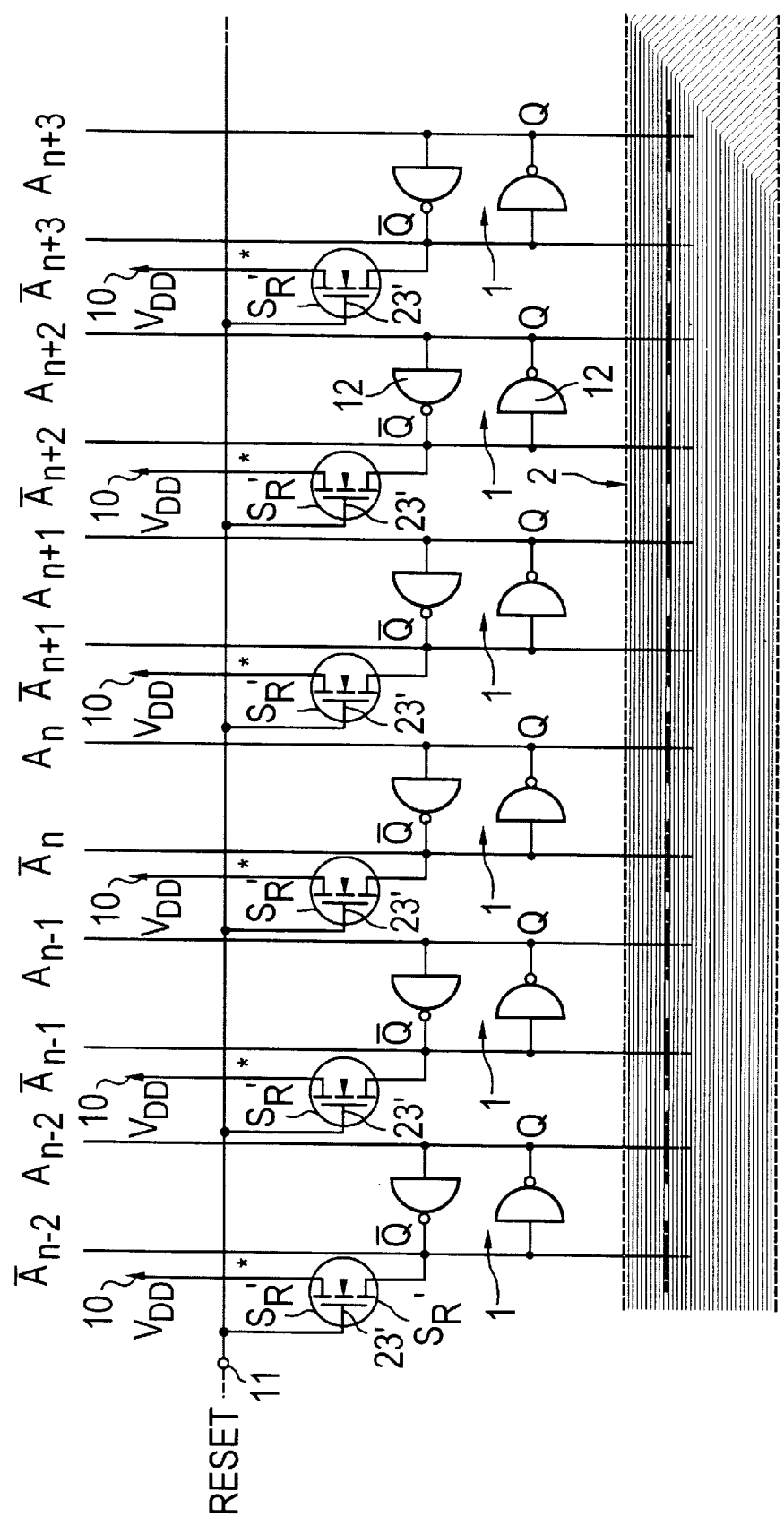

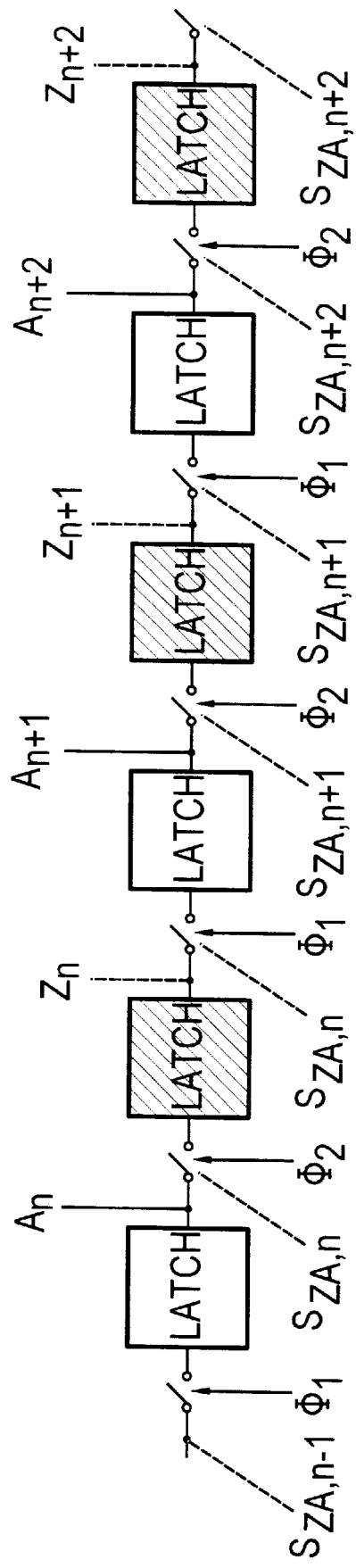

POINTER CIRCUIT WITH LOW SURFACE REQUIREMENT HIGH SPEED AND LOW POWER LOSS

BACKGROUND OF THE INVENTION

In certain circuit-oriented arrangements, what are known as pointer circuits are required. These circuits have a predetermined number of outputs. Only one output is selected to be in a determined logical state of two logically distinguishable states, while in contrast all other outputs are in the other logical state and are not selected.

By inputting a shift clock impulse, the one logical state can be displaced from the selected output to a next output adjacent to this output, so that the next output is subsequently in the one logical state and is selected, while all other outputs, including the one, are in the other logical state and are not selected. Pointer circuits of this sort can be used, for example, for the selection of a memory cell within a memory matrix (see European reference EP-A 0 738 974, Paul-Werner von Basse, Michael Bollu, Roland Thewes, Doris Schmitt-Landsiedel).

In previously known circuits of this sort, conventional shift register circuits are used, whereby the outputs of all registers except one contain the determined one logical state. Independent of the technology used, all these previously known circuits require a relatively high number of components per output. This relatively high space requirement can be very disadvantageous, particularly given application for the selection of a memory cell within a memory matrix, because the rows and column terminals in certain technologies or, respectively, in certain variant architectures of the cell field have very small spacings (see European reference EP-A 0 738 974, Paul-Werner von Basse, Michael Bollu, Roland Thewes, Doris Schmitt-Landsiedel; German reference P 44 37 581, L. Risch, F. Hofmann, W. Rösner, W. Krautschneider, "Verfahren zur Herstellung einer Festwertspeicherzellenanordnung mit vertikalen MOS-Transistoren,"; and European reference EP-A-0 78 84 866, W. Krautschneider, L. Risch, F. Hofmann, W. Rösner, "Festwertspeicherzellenanordnung und Verfahren zu deren Herstellung").

SUMMARY OF THE INVENTION

It is an object of the present invention to provide a pointer circuit whose surface requirement is lower than in the prior art circuits.

In contrast to the above-named known circuits in the form of shift registers, the inventive pointer circuit advantageously requires no intermediate memory stages. This means that in the inventive pointer circuit, advantageously, only exactly one memory is required per output. By this means, the outlay of components required is reduced considerably, leading to a significantly lower surface requirement in relation to the above-named known circuits. Thus, the inventive pointer circuit can advantageously be used for the selection of a memory cell within a memory matrix, in which the row lines or, respectively, column lines comprise very small spacings. In addition to this, the inventive pointer circuit is distinguished by simple initialization possibilities, and it is a robust static pointer circuit with high speed and low power loss.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1a shows the clock scheme for shift actions to be applied to the circuit according to FIG. 1, which bring about the displacement of the determined one logical state of the selected output;

FIG. 3 shows a block switching diagram of a third variant of an inventive pointer circuit, with the specific option of the initialization of this circuit;

FIG. 3a shows the pulse scheme for the shift actions to be applied to the circuit according to FIG. 3, which bring about the displacement of the determined one logical state of the selected output, and bring about the resetting of the memory and, via switches responsible for the resetting process of the memory, enable the specific option of the initialization of this circuit;

FIG. 4 shows a block switching diagram of a fourth variant of an inventive pointer circuit, with the particular characteristic that the resetting process and the setting process as in the second and third variant according to FIG. 2 and FIG. 3 are completely decoupled from one another, but, in contrast to the second and third variant, only two clock signals are required;

FIG. 4a shows the clock scheme for the shift actions to be applied to the circuit according to FIG. 4, which bring about the displacement of the determined one logical state of the selected output;

FIG. 6 shows a block switching diagram of a sixth variant of an inventive pointer circuit, which results as a modification of the first variant according to FIG. 1, with the aid of switches with mutually complementary control characteristics;

FIG. 6a shows the clock scheme for the shift actions to be applied to the circuit according to FIG. 6, which bring about the displacement of the determined one logical state of the selected output;

FIG. 7 shows a block switching diagram of a seventh variant of an inventive pointer circuit that results as a modification of the fourth variant according to FIG. 4, with the aid of switches with mutually complementary control characteristics, whereby here as well the resetting process and the setting process are completely decoupled from one another, and only two clock signals are required;

FIG. 7a shows the clock scheme for the shift actions to be applied to the circuit according to FIG. 7, which bring about the displacement of the determined one logical state of the selected output;

FIGS. 14a–14d show various arrangements of switches for the initialization of an inventive pointer circuit, whereby in FIG. 14a switches are shown for the initialization between memory terminals of the memory and reference potential $V_{SS}$, in FIG. 14b switches are shown for the initialization between memory terminals of the memory and a supply voltage $V_{DD}$, in FIG. 14c switches are shown for the initialization between memory terminals of the memory and reference potential $V_{SS}$, and in FIG. 14d switches are shown between the memory terminals of the memory and the supply voltage $V_{DD}$;

FIG. 15a shows a splitting of the $V_{SS}$ supply, in which nodes normally lying directly at $V_{SS}$ potential are divided inside the memory into $V_{SS1,Latch}$ and $V_{SS2,Latch}$, whereby the $V_{SS1,Latch}$ terminals, in contrast, are applied to an (H-active) signal RESET, and FIG. 15b shows a splitting of the $V_{DD}$ supply, in which the nodes normally lying directly at V$DD$ potential are divided within the memory into $V_{DD1,Latch}$ and $V_{DD2,Latch}$, whereby the $V_{DD1,Latch}$ terminals are applied directly to $V_{DD}$ potential, while in contrast the $V_{DD2,Latch}$ terminals are applied to the (here L-active) signal RESET;

FIGS. 16a and 16b show circuit-oriented conversions of the methods for initialization according to FIGS. 14a and 14d, which in the case of FIG. 16a consists in an addition of an n-MOS reset transistor (circled) to each memory of the inventive pointer circuit, and in the case of FIG. 16b consists in an addition of a p-MOS reset transistor (circled) to each memory;

FIG. 20 shows the construction of a conventional master-slave shift register using latches and switches located between the latches.

DESCRIPTION OF THE PREFERRED EMBODIMENTS

With reference to FIGS. 1–23, the inventive pointer circuit has a predetermined number of outputs . . . $A_{n-2}$, $A_{n-1}$, $A_n$, $A_{n+1}$, $A_{n+2}$ . . . (or . . . $\overline{A}_{n-2}$, $\overline{A}_{n-1}$, $\overline{A}_n$, $\overline{A}_{n+1}$, $\overline{A}_{n+2}$ . . . ), and serves for the selection of one of these outputs in such a way that this output is the only one that is in a determined one logical state of two logically distinguishable states. In contrast, all other outputs are in the other logical state and are not selected. Also, the one logical state is displaced from the one output to an output immediately adjacent to this output, by means of the inputting of a shift clock impulse, so that after this displacement the immediately adjacent output is in the one logical state and is the selected output, while all other outputs, including the one output, are in the other logical state and are not selected.

The two logically distinguishable states are designated "1" and "0," and it is assumed in the following, without limitation of generality, that in the case of the outputs . . . $A_{n-2}$, $A_{n-1}$, $A_n$, $A_{n+1}$, $A_{n+2}$ . . . , the one logical state that selects the one output is the state "1."

For the outputs . . . $\overline{A}_{n-2}$, $\overline{A}_{n-1}$, $\overline{A}_n$, $\overline{A}_{n+1}$, $\overline{A}_{n+2}$ . . . , which are complementary to the outputs $A_{n-2}$, $A_{n-1}$, $A_n$, $A_{n+1}$, $A_{n+2}$ . . . , the latter means that the logical state selecting the one output is the state "0."

If for example $A_n$ is an output selected from the outputs . . . $A_{n-2}$, $A_{n-1}$, $A_n$, $A_{n+1}$, $A_{n+2}$ . . . , this means that this output is in the state "1" and all other outputs . . . $A_{n-2}$, $A_{n-1}$, $A_{n+1}$, $A_{n+2}$ . . . are at "0."

By means of the inputting of a shift clock impulse, the state "1" is displaced from the output $A_n$ to an output $A_{n+1}$, immediately adjacent to this output $A_n$, so that after this shift pulse the immediately adjacent output $A_{n+1}$ is in the one logical state and is the selected output, while all other outputs . . . $A_{n-2}$, $A_{n-1}$, $A_n$, $A_{n+2}$ . . . , including the one output $A_n$, are now in the other state "0" and are not selected.

Figure 17:
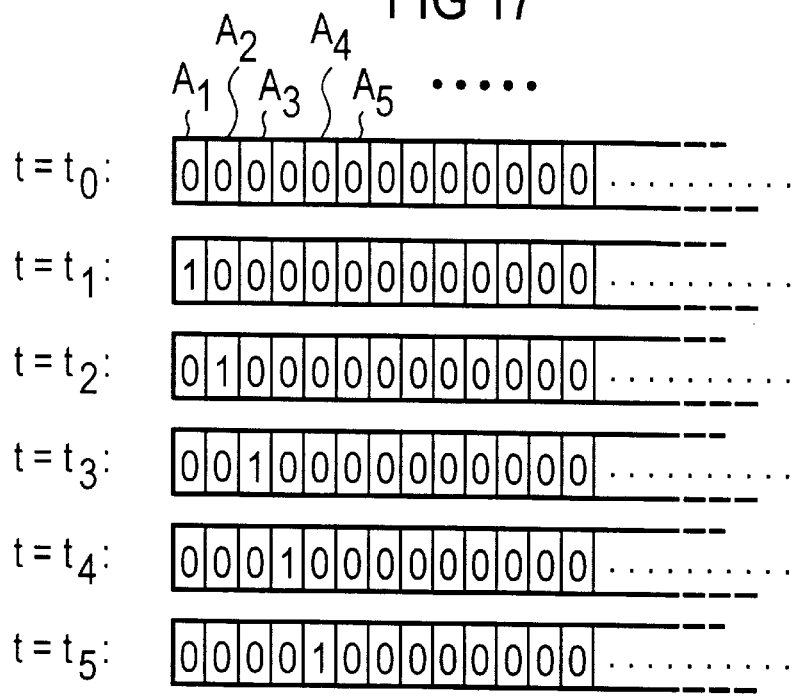
FIG. 17 shows a schematic view of the output signal of a pointer circuit at different times.

This situation is graphically represented in FIG. 17, whereby as the output state at time $t=t_0$ it is assumed that the pointer circuit is in the initialized, i.e. reset, state, and all outputs . . . $A_{n-2}$, $A_{n-1}$, $A_n$, $A_{n+1}$, $A_{n+2}$ . . . , are thus at "0." At the next-following clock time $t=t_1$, the first output $A_1$ is at "1" and all other outputs $A_2$, $A_3$ . . . are at "0." At all further times shown $t=t_i$ ($i \geq 2$), in FIG. 17 the state of the circuit after the receipt of a respective further shift pulse is shown, leading respectively to the pushing forward of the state "1" by one output.

The specification for the outputs . . . $A_{n-2}$, $A_{n-1}$, $A_n$, $A_{n+1}$, $A_{n+2}$ . . . , holds in an analogous fashion for the complementary outputs . . . $\overline{A}_{n-2}$, $\overline{A}_{n-1}$, $\overline{A}_n$, $\overline{A}_{n+1}$, $\overline{A}_{n+2}$ . . . in relation to the state "0."

In the pointer circuit described here, according to the invention a respective static memory 1 is allocated to each output . . . $A_{n-2}$, $A_{n-1}$, $A_n$, $A_{n+1}$, $A_{n+2}$ . . . (or . . . $\overline{A}_{n-2}$, $\overline{A}_{n-1}$, $\overline{A}_n$, $\overline{A}_{n+1}$, $\overline{A}_{n+2}$ . . . ), of which each respectively comprises a pair of memory terminals Q and $\overline{Q}$ complementary to one another, in such a way that this pair of terminals Q and $\overline{Q}$ are always in the two stored mutually differing states "1" and "0" or "0" and "1," whereby a determined memory terminal of each memory 1 is connected with the output allocated to this memory 1.

By way of example, in the case of the terminals . . . $A_{n-2}$, $A_{n-1}$, $A_n$, $A_{n+1}$, $A_{n+2}$ . . . , let the terminal Q of each memory 1 be connected with the terminal allocated to this memory 1, and in the case of the terminals . . . $\overline{A}_{n-2}$, $\overline{A}_{n-1}$, $\overline{A}_n$, $\overline{A}_{n+1}$, $\overline{A}_{n+2}$ . . . let the terminal $\overline{Q}$ of each memory 1 be connected with the terminal allocated to this memory 1. The converse could also hold. For the following, let the first-named case be assumed, without limitation of generality.

In addition, according to the invention a shift circuit 2, connected with the determined memory terminal Q (or $\overline{Q}$) of each memory 1, is provided for the production of the state "1" (or "0") at the determined memory terminal Q (or $\overline{Q}$) of a memory 1 and for the displacement of the state "1" (or "0") from the determined memory terminal Q (or $\overline{Q}$) of a memory "1" (or "0") to the determined memory terminal Q (or $\overline{Q}$) of a memory 1 immediately adjacent to this one memory 1. This is effected by inputting at least one shift clock impulse, which at the same time brings it about that, with the exception of the respective memory 1, whose determined memory terminal Q (or $\overline{Q}$) is in the state "1" (or "0"), the determined memory terminals Q (or $\overline{Q}$) of all the other memories "1" are in the other logical state "0" (or "1").

The shift circuit 2 preferably and advantageously has for each memory 1 a respective controllable switch S individually allocated to this memory 1, which switch is connected between the determined memory terminal Q (or $\overline{Q}$) of this memory 1 and a terminal for the application of a potential. It has a control input 20 for the application of a switching impulse for the optional closing and/or blocking of the switch 20, and for each memory 1 has a controllable switch S individually allocated to this memory 1. The switch is connected between the other memory terminal $\overline{Q}$ (or Q) of this memory 1 and a terminal for the application of a potential. The shift circuit 2 also has a control input 20 for the application of a switching impulse for the optional closing and/or blocking of the switch 20.

The inventive pointer circuit with a shift circuit 2 constructed in this way forms the basis of the numerous variant embodiments of the inventive pointer circuit shown in FIGS. 1–7.

For the following application of the functioning of the circuits according to FIGS. 1–7, the following convention holds without limitation of generality. Let the switches S be closed if the state "1" is adjacent to them via the control input 20. If the control input "0" is adjacent to the control input 20, the switches S should block. In the variants according to FIGS. 5–7, additional switches S' are used that has a control characteristic that is precisely complementary to a switch S, i.e., the additional switches S' close when the state "0" is adjacent to the control input 20', whereas, when the state "1" is adjacent to the control input 20', they are opened, and block. These switches S' are additionally characterized by a small circle at the control input 20'.

Let the state "1" correspond to a high voltage level H and the state "0" correspond to a low voltage level L.

Figure 1:
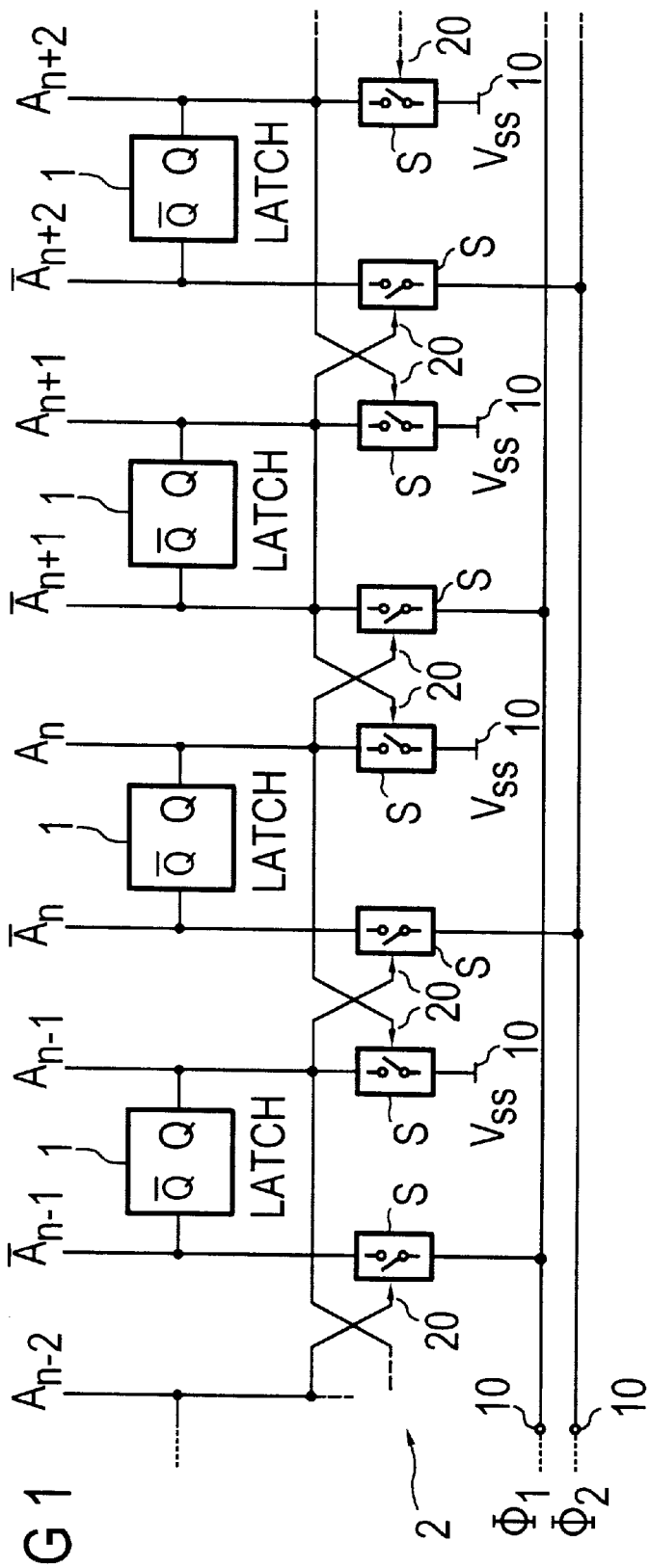
FIG. 1 shows a block switching diagram of a first variant of an inventive pointer circuit.

In the pointer circuit according to FIG. 1, each controllable switch S allocated individually to a memory 1, which switch is on the one hand connected with the determined memory terminal Q of this memory 1, is connected on the other hand with a terminal 100 for the application of a reference potential $V_{SS}$.

In addition, each controllable switch S allocated individually to a memory 1, which switch is connected with the memory terminal $\overline{Q}$ of this memory 1, is connected with a terminal 10 or 10' for the application of a clock signal $\phi_1$ or $\phi_2$ in such a way that these switches S are successively connected in alternating fashion with a terminal 10 or 10' for the application of a clock signal $\phi_1$ or $\phi_2$, and with a terminal 10 for the application of another clock signal $\phi_2$ or $\phi_1$. For example, the memory terminal $\overline{Q}$ of the memory 1 allocated to the output $\overline{A}_{n-1}$ is connected with a terminal 10 for the application of the one clock signal $\phi_1$. A memory terminal $\overline{Q}$ of another memory 1 allocated to the output $\overline{A}_n$ immediately adjacent to this output $\overline{A}_{n-1}$ is connected with a terminal 10' for the application of the other clock signal $\phi_2$. A memory terminal $\overline{Q}$ of yet another memory 1 allocated to the output $\overline{A}_{n+1}$ immediately adjacent to this output $\overline{A}_n$ is again connected with a terminal 10 for the application of the one clock signal $\phi_1$.

In addition, the determined memory terminal Q of a memory 1 is connected with the control input 20 of a switch S allocated to the memory 1 immediately adjacent to this memory 1, which switch is connected with the determined memory terminal Q of this memory 1, and with the control input 20 of a switch S allocated to another memory 1 immediately adjacent to this memory 1, which another switch is connected with the other memory terminal $\overline{Q}$ of this memory 1.

Under the assumption that the determined memory terminal Q of the one memory 1 is at "1," and thus at the level H, corresponding to the convention named above exactly two switches S, S are closed, namely the switch S connected between the determined memory terminal Q of an immediately adjacent memory 1 and the terminal 100 for the application of the reference potential $V_{SS}$, and the switch S connected between the other memory terminal $\overline{Q}$ of the other immediately adjacent memory 1 and the terminal 10 or 10' for the application of a clock signal $\phi_1$ or $\phi_2$.

If, for example, in the example according to FIG. 1 the determined memory terminal Q, connected with the output $A_n$, of the memory 1 allocated to this output $A_n$ is in the state "1," then the switch S connected between the output $A_{n+1}$ and the reference potential $V_{SS}$, and the switch S connected between the output $\overline{A}_{n+1}$ and the terminal 10 for the application of the clock signal $\phi_1$, are closed.

If the terminals 10 or 10' for the application of the clock signals $\phi_1$ or $\phi_2$ are both at H potential, all switches S of the pointer circuit, in particular also the two closed switches, are in this currentless state. This state thus represents a static idle state of the circuit. A shift of the state "1" to an immediately adjacent output, e.g. from the output $A_n$ to the output $A_{n+1}$, is achieved as follows: by lowering the shift clock signal $\phi_1$ to the L level, the output $\overline{A}_{n+1}$ is also changed from H to L. Correspondingly, after a short reaction time of the latch or, respectively, memory 1, the level complementary thereto arises at the output $A_{n+1}$, i.e., the output $A_{n+1}$ then assumes the H level, and thereby the state "1." By this means, the switches S located between the output $\overline{A}_{n+2}$ and the terminal 10 for the clock signal $\phi_2$, and between the terminal $A_n$ and the reference potential $V_{SS}$, are closed. In this way, the terminal $A_n$ is drawn to L potential, which effects a resetting of the corresponding memory 1, so that, again, the terminal $A_n$ is at "0" and the complementary terminal $\overline{A}_n$ is at "1." The clock signal $\phi_1$ is now again set to H potential. Likewise, the circuit is again in a static state corresponding to the following description: the output $A_{n+1}$ is in the state "1," and all other outputs . . . $A_{n-2}$, $A_{n-1}$, $A_n$, $A_{n+2}$, . . . are in the state "0." Analogously to this, the output $\overline{A}_{n+1}$ is in the state "0" and all other outputs . . . $\overline{A}_{n-2}$, $\overline{A}_{n-1}$, $\overline{A}_n$, $\overline{A}_{n+2}$, . . . are in the state "1."

Correspondingly, the switch S between the output $A_n$ and the reference potential $V_{SS}$ and the switch S between the node $\overline{A}_{n+2}$ and the terminal 10' for the clock signal $\phi_2$ are now closed, whereby both switches S, S are without current, due to the above-described state of the outputs and the condition that both clock signals $\phi_1$ or $\phi_2$ are at H potential, i.e. $\phi_1 = \phi_2 = H$.

A new shifting of the state "1" to the output $A_{n+2}$ results in an analogous manner, only in this case the clock signal $\phi_2$ must be lowered instead of the clock signal $\phi_1$ in order to introduce the setting process in the corresponding memory 1.

An example for clock signals $\phi_1$ and $\phi_2$, which can be used for the operation of the circuit according to FIG. 1, are shown in FIG. 1a in chronological allocation to one another.

Figure 2:
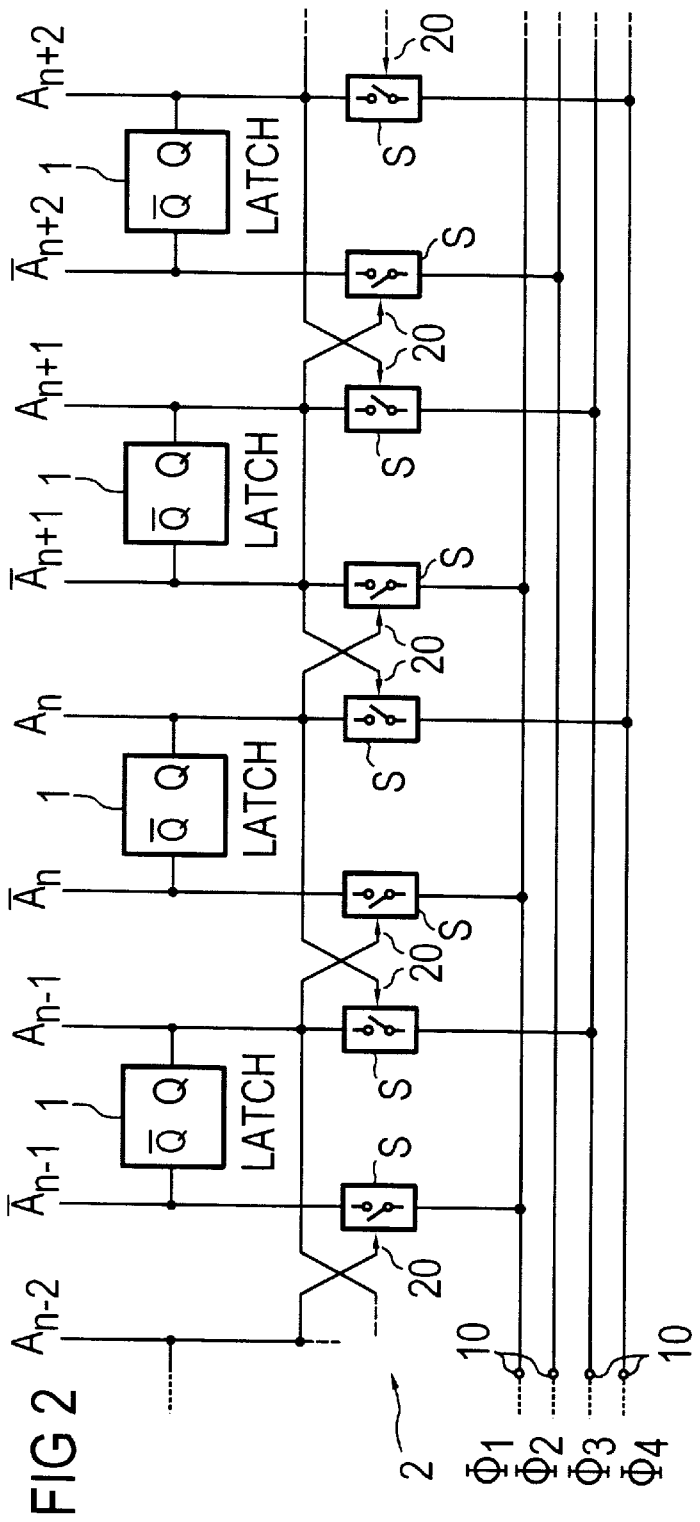
FIG. 2 shows a block switching diagram of a second variant of an inventive pointer circuit.

The circuit according to FIG. 2 differs from the circuit according to FIG. 1 only in that each controllable switch S, allocated individually to a memory 1, which switch is connected with the determined memory terminal Q of this memory 1, is connected not with the reference potential $V_{SS}$, but rather with a terminal 10" or 10'" for the application of a potential in the form of an additional clock signal $\phi_3$ or $\phi_4$, in such a way that these switches S are successively connected in alternating fashion with a terminal 10" or 10'" for the application of a further clock signal $\phi_3$ or $\phi_4$, or with a terminal 10" or 10'" for the application of another additional shift pulse $\phi_4$ or $\phi_3$. For example, the memory terminal Q of the memory 1 allocated to the output $A_{n-1}$ is connected with a terminal 10" for the application of the further clock signal $\phi_3$. The memory terminal Q of the memory 1 allocated to the output $A_n$ immediately adjacent to this output $A_{n-1}$ is connected with a terminal 10'" for the application of the other additional clock signal $\phi_4$. The other memory terminal Q of the memory 1 allocated to the output $A_{n+1}$ immediately adjacent to this output $A_n$ is again connected with a terminal 10" for the application of the additional clock signal $\phi_3$.

From the above specification of the functioning of the circuit according to FIG. 1, it can be learned that the introduction of a setting process of a memory 1 automatically brings about a resetting of the previous memory 1, which supplied the signal required for the setting process. However, the functioning of this circuit is ensured in that all memories 1 and switches S located therein comprise a certain run time or, respectively, reaction time. In this way, in a real circuit the memory 1 to be reset does not assume L potential at its determined memory terminal Q until a little later, after the setting process of the memory 1 to be set has taken place.

Figure 2A:
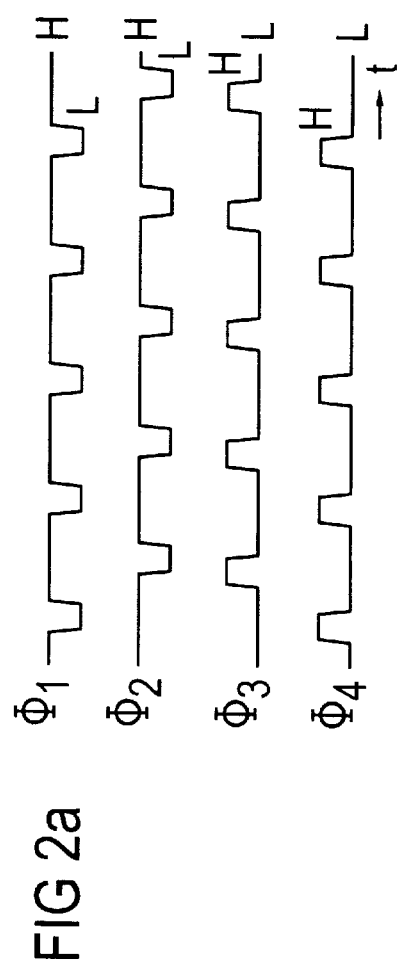
FIG. 2a shows the pulse scheme for the shift actions to be applied to the circuit according to FIG. 3, which bring about the displacement of the determined one logical state of the selected output, and bring about the resetting of the memory.

By means of the circuit according to FIG. 2, the resetting process can advantageously take place completely decoupled from the execution of the setting process, if this circuit is driven with the clock signals $\phi_1$, $\phi_2$, $\phi_3$ and $\phi_4$ shown in FIG. 2a in chronological allocation to one another. Let it thereby be assumed that the circuit according to FIG. 2 is first in a static state in which the output $A_n$ is in the state "1." The terminals 10 and 10' for the application of the clock signals $\phi_1$ and $\phi_2$ are thereby at the potential or, respectively, level H, and the terminals 10" and 10'" for the application of the additional clock signals $\phi_3$ and $\phi_4$, in contrast, are at the potential or, respectively, level L, i.e. at this time $\phi_1=\phi_2=H$ and $\phi_3=\phi_4=L$.

The setting process of the output $A_{n+1}$ takes place in the same way as in the circuit according to FIG. 1, by switching the clock signal $\phi_1$ to the level L. However, in the circuit according to FIG. 2 the terminal 10'" for the application of the additional clock signals $\phi_4$ are previously set to high potential H. Shortly after the change of the datum of the clock signal $\phi_1$ from level H to level L, the switch S between the output $A_n$ and the terminal 10'" for the application of the additional clock signal $\phi_4$ becomes conductive, since then the output $A_{n+1}$, and thus the control input 20, connected with this output $A_{n+1}$, of this switch S is in the state "1," and thus at the level H. Since, however, $A_n=\phi_4=H$ also holds at this time, there is still no change of the datum of $A_n$. The resetting process at the output $A_n$ to the level L takes place only when the clock signal $\phi_4$ is again lowered to the level L.

A displacement of the state "1" to the output $A_{n+2}$ and a resetting of the output $A_{n+1}$ results in analogous fashion if in the above explanation the clock signals $\phi_1$ and $\phi_4$ are exchanged for the clock signals $\phi_2$ and $\phi_3$.

In the circuit shown in FIG. 3, each controllable switch S individually allocated to a memory 1, which switch is on the one hand connected with the determined memory terminal Q of this memory 1, is on the other hand connected with a terminal 100 for the application of a determined reference potential $V_{SS}$.

In addition, each controllable switch S individually allocated to a memory 1, which switch is connected with the other memory terminal $\overline{Q}$ of this memory 1, is connected with the terminal 10 or 10' for the application of a clock signal $\phi_1$ or $\phi_2$ in such a way that these switches S are successively connected in alternating fashion with a terminal 10 or 10' for the application of a clock signal $\phi_1$ or $\phi_2$, and with terminals 10' or 10 for the application of another clock signal $\phi_2$ or $\phi_1$. For example, the other memory terminal $\overline{Q}$ of the memory 1 allocated to the output $\overline{A}_{n-1}$ is connected with a terminal 10 for the application of the one clock signal $\phi_1$, the other memory terminal $\overline{Q}$ of the memory 1 allocated to the output $\overline{A}_n$ immediately adjacent to this output $\overline{A}_{n-1}$ is connected with a terminal 10' for the application of the other clock signal $\phi_2$, the other memory terminal $\overline{Q}$ of the memory 1 allocated to the output $\overline{A}_{n+1}$ immediately adjacent to this output $\overline{A}_n$ is again connected with a terminal 10 for the application of the one clock signal $\phi_1$.

Moreover, the determined memory terminal Q of a memory 1 is connected to the control input 20 of a switch S, which switch is allocated to a memory 1 immediately adjacent to the one memory 1, and is connected with the other memory terminal $\overline{Q}$ of this immediately adjacent memory 1.

The distinguishing characteristic of the circuit according to FIG. 3 is that the control input 20 of a switch S connected with a determined memory terminal Q of a memory 1 is connected with a terminal 10" or 10'" for the application of an additional clock signal $\phi_3$ or $\phi_4$, in such a way that the control inputs 20 of these switches S are successively connected in alternating fashion with a terminal 10" or 10'" for the application of an additional clock signal $\phi_3$ or $\phi_4$ and with a terminal 10'" or 10" for the application of another additional clock signal $\phi_4$ or $\phi_3$. For example, the control terminal 20 of the memory 1 allocated to the output $A_{n-1}$ is connected with a terminal 10" for the application of the additional clock signal $\phi_3$, the control terminal 20 of the memory 1 allocated to the output $A_n$ is connected with a terminal 10'" for the application of the other additional clock signal $\phi_4$, the control terminal 20 of the memory 1 allocated to the output $A_{n+1}$ is again connected with a terminal 10" for the application of the one additional clock signal $\phi_3$.

In the circuit according to FIG. 3 as well, the resetting process is decoupled from the execution of the setting process. However, in contrast to the circuit according to FIG. 2, in the circuit according to FIG. 3 the resetting signal does not reach only the memory 1, which is located in circuit-oriented terms before the last-set memory 1. In addition, in the circuit according to FIG. 3 the resetting signal for a switch S arranged between a determined memory terminal Q and the reference potential $V_{SS}$ is not derived from a determined memory terminal Q, but rather consists of an additional clock signal $\phi_3$ or $\phi_4$.

For a more concrete specification of the manner of functioning of the circuit according to FIG. 3, let it be assumed in turn that this circuit is first in a static state in which the output $A_n$ is in the state "1," and all other outputs are in the state "0." The terminals 10 and 10' for the application of the clock signals $\phi_1$ and $\phi_2$ are thereby at the potential or, respectively, level H, while in contrast the terminals 10" or 10'" for the application of the additional clock signals $\phi_3$ and $\phi_4$ are at the potential or, respectively, level L, i.e. at this time $\phi1=\phi2=H$ and $\phi3=\phi4=L$.

The setting process of the output $A_{n+1}$ takes place by connecting the shift action signal $\phi_1$ to the level L. Given driving with the clock signals $\phi_1$, $\phi_2$, $\phi_3$, and $\phi_4$, shown in FIG. 3a in chronological allocation to one another, the terminals 10'" for the application of the clock signal $\phi_4$ are set to high potential H only after termination of the setting process of the memory 1 to be set, by which means the switches S allocated to the outputs $A_{n+2k}$ with k=1,2,3, . . . short-circuit these outputs $A_{n+2k}$ to reference potential $V_{SS}$. There thus results a resetting of the state of the output $A_n$ to the potential L; before closing of the corresponding switches S, all outputs $A_{n+2k}$ are already at the level L. After the termination of the setting process of the output $A_{n+1}$ and of the resetting process of the output $A_n$, the clock signals $\phi_1$ and $\phi_4$ are again set to $\phi_1=\phi_2=H$ and $\phi3=\phi4=L$.

In the circuit shown in FIG. 4, each controllable switch S individually allocated to a memory 1, which switch is connected with the determined memory terminal Q of this memory 1, is connected with a terminal 10 or 10' for the application of a clock signal $\phi_1$ or $\phi_2$ in such a way that all these switches S are successively connected in alternating fashion with a terminal 10 or 10' for the application of a clock signal $\phi_1$ or $\phi_2$ and with a terminal 10' or 10 for the application of another clock signal $\phi_2$ or $\phi_1$. For example, the memory terminal Q of the memory 1 allocated to the output $A_{n-2}$ is connected with a terminal 10 for the application of the one clock signal $\phi_1$. The memory terminal Q of the memory 1 allocated to the output $A_{n-1}$ immediately adjacent to this output $A_{n-2}$ is connected with a terminal 10' for the application of the other clock signal $\phi_2$. The determined memory terminal Q of the memory 1 allocated to the output $A_n$ immediately adjacent to this output $A_{n-1}$ is again connected with a terminal 10 for the application of the one clock signal $\phi_1$.

In addition, each controllable switch S individually allocated to a memory 1, which switch is connected with the other memory terminal $\overline{Q}$ of this memory 1, is connected with a terminal 10, 10', 10", 10'" for the application of a determined reference potential $V_{SS}$.

In addition, a terminal 10 or 10" for the application of a clock signal $\phi_1$ or $\phi_2$, with which is connected a controllable switch S connected with the memory terminal Q of a memory 1, is connected via a controllable intermediate switch S1 with the control terminal 20 of the switch S connected with the other memory terminal $\overline{Q}$ of a memory 1 immediately adjacent to the one memory 1. For example, the terminal 10 for the application of the clock signal $\phi_1$, with which is connected the controllable switch S connected with the memory terminal Q of the memory 1 (not shown) allocated to the output $A_{n-2}$, is connected via a controllable intermediate switch S1 with the control terminal 20 of the switch S connected with the other memory terminal $\overline{Q}$ of the memory 1 allocated to the immediately adjacent output $A_{n-1}$, the terminal 10' for the application of the clock signal $\phi_2$, with which is connected the controllable switch S connected with the memory terminal Q of the memory 1 allocated to the output $A_{n-1}$, is connected via a controllable intermediate switch S1 with the control terminal 20 of the switch S connected with the other memory terminal $\overline{Q}$ of the memory 1 allocated to the immediately adjacent output $A_n$, the terminal 10 for the application of the clock signal $\phi_1$, with which is connected the controllable switch S connected with the determined memory terminal Q of the memory 1 allocated to the output $A_n$, is connected via a controllable intermediate switch S1 with the control terminal 20 of the switch S connected with the other memory terminal $\overline{Q}$ of the memory 1 allocated to the immediately adjacent output $A_n$.

Moreover, the memory terminal Q of a memory 1 is connected both with the control terminal 21 of the intermediate memory S1, which is connected between the terminal 10 or 10' for the application of a clock signal $\phi_1$ or $\phi_2$, with which is connected the controllable switch S connected with the memory terminal Q of this memory 1, and the other memory terminal $\overline{Q}$ of the memory 1 immediately adjacent to the one memory 1, and also with the control terminal 20 of the switch S connected with the determined memory terminal Q of another memory 1 immediately adjacent to the one memory 1. For example, the determined memory Q of the memory 1 allocated to the output $A_{n-1}$ is connected both with the control terminal 21 of the intermediate memory S1, which is connected between the terminal 10' for the application of a clock signal $\phi_2$, with which is connected the controllable switch S connected with the determined memory terminal Q of this memory 1, and the other memory terminal $\overline{Q}$ of the memory 1 allocated to the one immediately adjacent terminal $A_n$, and also with the control terminal 20 of the switch S connected with the memory terminal Q of the memory 1 (not shown) allocated to the other immediately adjacent terminal $A_{n-2}$. The memory terminal Q of the memory 1 allocated to the output $A_n$ is connected both with the control terminal 21 of the intermediate memory S1 connected between the terminal 10 for the application of a clock signal $\phi_1$, with which is connected the controllable switch S connected with the determined memory terminal Q of this memory 1, and the other memory terminal $\overline{Q}$ of the memory 1 allocated to the one immediately adjacent terminal $A_{n+1}$, and also with the control terminal 20 of the switch S connected with the memory terminal Q of the memory 1 (not shown) allocated to the other immediately adjacent terminal $A_{n-2}$, etc.

In addition, in the circuit according to FIG. 4 the other memory terminal $\overline{Q}$ of a memory 1 is connected with a control input 22 of an additional intermediate switch S2, which is connected between the control terminal 20 for the other memory terminal $\overline{Q}$ of a memory 1 immediately adjacent to this memory 1 and the reference potential $V_{SS}$. For example, the other memory terminal $\overline{Q}$ of the memory 1 allocated to the output $A_{n-1}$ is connected with the control input 22 of the additional intermediate switch S2, which is connected between the control terminal 20 of the memory 1 allocated with the other memory terminal $\overline{Q}$ to the output $A_n$ and the reference potential $V_{SS}$. The other memory terminal $\overline{Q}$ of the memory 1 allocated to the output $A_n$ is connected with the control input 22 of the additional intermediate switch S2, which is connected between the control terminal 20 of the memory 1 allocated with the other memory terminal $\overline{Q}$ to the output $A_{n+1}$ and the reference potential $V_{SS}$. The other memory terminal $\overline{Q}$ of the memory 1 allocated to the output $A_{n+1}$ is connected with the control input 22 of the additional intermediate switch S2, which is connected between the control terminal 20 of the memory 1 allocated with the other memory terminal $\overline{Q}$ of the output $A_{n+1}$ and the reference potential $V_{SS}$.

The additional intermediate switches S2 are not absolutely required; under certain very particular circumstances, which in turn depend on a technological realization for the other memory terminal $\overline{Q}$ of the memories 1, they can be eliminated.

In the circuit according to FIG. 4, the setting process and the resetting process are again completely decoupled from one another, although, in contrast to the variants according to FIGS. 2 and 3, only two clock signals $\phi_1$ and $\phi_2$ are used. In principle, this is achieved in that the setting process of a switch 1 is introduced by means of the level H at the terminal 10 and 10' allocated to this memory 1 for the application of a clock signal $\phi_1$ and $\phi_2$, while the resetting process of the preceding memory 1 is triggered by the level L at the same terminal. For the realization of this design, however, at least three controllable switches S are required per transition of one memory 1 to the immediately adjacent memory 1, instead of only two, as previously required in the other variants.

For a more detailed explanation of the manner of functioning of the circuit according to FIG. 4, let it be assumed in turn that this circuit is first in a static state, in which the output $A_n$ is in the state "1," and all other outputs are in the state "0." The terminals 10 and 10' for the application of the clock signals $\phi_1$ and $\phi_2$ are thereby at the potential or, respectively, level L, i.e., at this time $\phi_1=\phi_2=L$.

In this case, the intermediate switch S1 arranged between the output $A_n$ and the output $\overline{A}_{n+1}$ and the switch S connected with the determined memory terminal Q of the memory 1 allocated to the output $A_{n-1}$ are respectively closed. In addition, all further intermediate switches S2 are closed. All other switches S and S1 are open. The intermediate switch S1 arranged between the output $A_n$ and the output $\overline{A}_{n+1}$ thus connects the control terminal 20 for the other memory terminal $\overline{Q}$ of the memory 1 allocated to the output $\overline{A}_{n+1}$ with the clock signal $\phi_1$. The control terminals 20 of the switches S connected with the other memory terminals $\overline{Q}$ of the memories 1 are connected at all outputs, with the exception of the output $A_{n+1}$, with the reference potential $V_{SS}$, e.g. ground, via the additional intermediate switches S2. In addition, the switch S connected with the output $A_{n-1}$ connects this output $A_{n-1}$ with the clock signal $\phi_1$. Since both the signal $\phi_1$ and also the output $A_{n-1}$ are at the level L during the entire process discussed below of the setting of the output $A_{n+1}$ and the resetting of of the output $A_n$ to the level L, the state of the switch S connected with the output $A_{n-1}$ no longer plays a role in this context. When the clock signal $\phi_1$ is switched to the level H, the switch S connected with the output $\overline{A}_{n+1}$ complementary to the output $A_{n+1}$ short-circuits this output $\overline{A}_{n+1}$ to reference potential $V_{SS}$ (level L), whereby the logical state at the output $A_{n+1}$ is inverted. As long as the clock signal $\phi_1$ remains at the level H, the overall circuit is in the state in which the outputs $A_n$ and $A_{n+1}$ are respectively in the state "1," while in contrast all other outputs are in the state "0," i.e., . . . $=A_{n-2}=A_{n-1}=A_{n+1}=A_{n+2}=$. . . =0 and $A_n=A_{n+1}=1$.

In addition to the switches already closed, the switches S connected with the determined memory terminals Q of the memories 1, and the intermediate switches S1, are now also closed. In this way, a connection of the output $A_n$ to the signal $\phi_1$ is produced. If the signal $\phi_1$ is now decreased again to the level L, the output $A_n$ is also reset.

A displacement of the state "1" to the output $A_{n+2}$, and a resetting of the output $A_{n+1}$ takes place in a manner analogous to that described above, if in place of the signal $\phi_1$ the clock signal $\phi_2$ now runs through an H-cycle.

From the above specification, it can be seen that the additional intermediate switches S2 serve only to set the control terminals of the switches S connected with the complementary outputs . . . $\overline{A}_{n-2}, \overline{A}_{n-1}, \overline{A}_n, \overline{A}_{n+1}, \overline{A}_{n+2}$ . . . to a defined potential, if these are not connected with one of the clock signals $\phi_1$ or $\phi_2$ via an intermediate switch S1. This measure is useful for example when the switches S connected with the complementary outputs consist of n-MOS transistors. In this case, the control terminal 20 of these switches S corresponds to the gate terminal of the transistors, which in turn means that the control input of these switches S is extremely high-ohmic. If, in this case, the additional intermediate switches S2 were not present, e.g. capacitive couplings at the gate nodes of these switches S, or also leakage currents within the circuit, could lead to the occurrence at the gates of these switches S of potentials causing these transistors to conduct. Unintended switching processes could thereby be triggered.

If, in contrast, the switches S connected with the complementary outputs are realized e.g. by npn bipolar transistors, the base of these transistors forms the control terminal of the switch S, the emitter is at reference potential, e.g. at reference potential or ground, and the collector at the complementary memory terminal $\overline{Q}$ of the latch or, respectively, of the memory 1 with which this switch S is connected. In this case, the additional intermediate switches S2 can be eliminated, because, even in the non-conducting state of the transistors forming the switches S connected with the complementary memory terminals $\overline{Q}$, the base-emitter path already represents a comparatively low-ohmic connection to ground, so that the influence of capacitive couplings or leakage currents is massively reduced. This is because a switching function of the switches S connected with the complementary memory terminals $\overline{Q}$ results if and only if a certain base current is provided for the transistors S forming these switches S. However, this is the case only if the base of such a switch S is connected, via a closed intermediate switch S1, with a clock signal $\phi_1$ or $\phi_2$, and this signal $\phi_1$ or $\phi_2$ is at the level H.

An example of clock signals $\phi_1$ and $\phi_1$ that can be used for the operation of the circuit according to FIG. 4 are shown in FIG. 4a in chronological allocation to one another.

Figure 5:
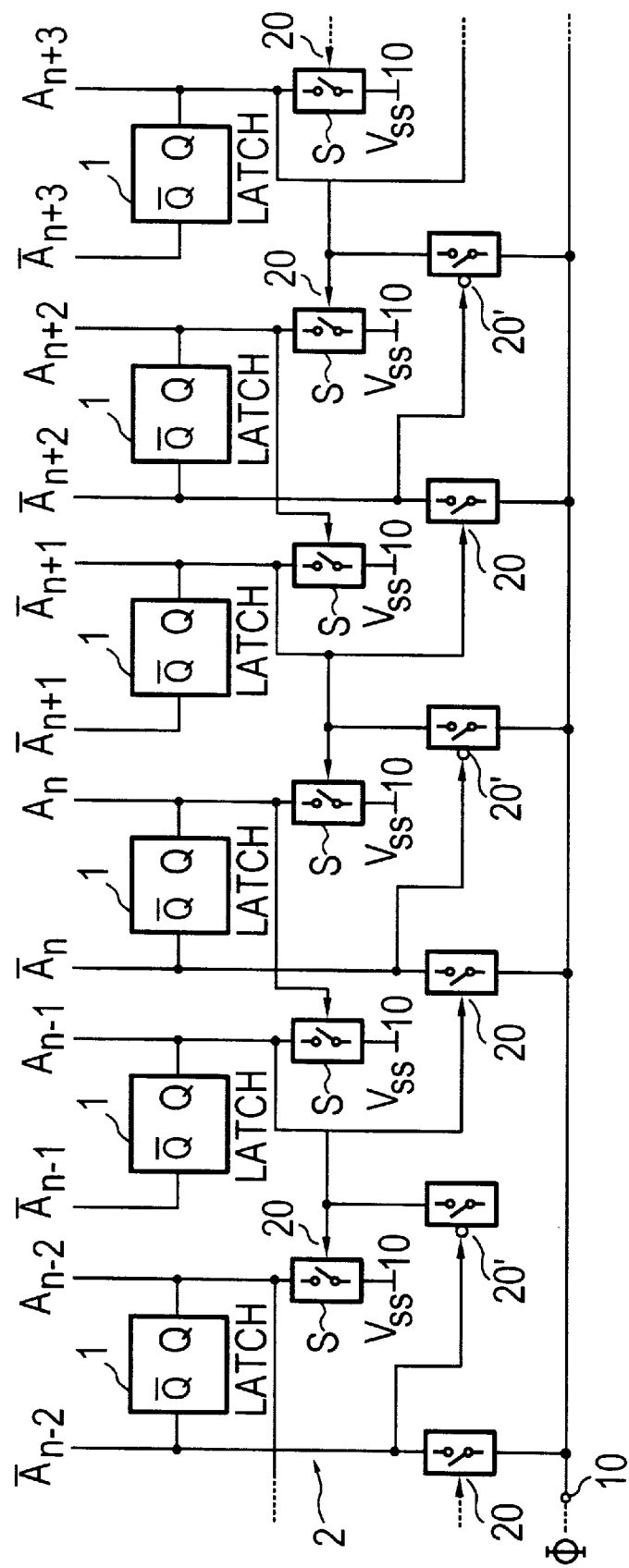
FIG. 5 shows a block switching diagram of a fifth variant of an inventive pointer circuit, with the particular characteristic that the use of switches with control characteristics complementary to one another enables the operation of this circuit with only one clock signal.

In the circuit shown in FIG. 5, each controllable switch S individually allocated to a memory 1, which switch is connected with the determined memory terminal Q of this memory 1, is connected with a terminal for the application of a determined reference potential, e.g. $V_{SS}$.

A controllable switch S is respectively individually allocated to every second memory 1 in the series of memories 1, which switch is connected with the other memory terminal $\overline{Q}$ of this next-but-one memory 1, and is connected with a terminal 10 for the application of a clock signal $\phi$.

Moreover, the determined memory terminal Q of each memory 1 located between two adjacent next-but-one memories 1 is connected with the control input 20 of the switch S connected with the determined memory output Q of an adjacent next-but-one memory 1, and with the control input 20 of the switch S connected with the other adjacent next-but-one memory 1. Furthermore, respective additional switch S', with a respective control input 20' for the application of a switching impulse for the optional closing and/or blocking of the additional switch S' and with a control characteristic complementary to a switch S is connected between the control input 20 of the switch S connected with the determined memory output Q of each next-but-one memory 1, and is connected with a terminal 10 for the application of the clock signal $\phi$, whereby the other memory terminal $\overline{Q}$ of this next-but-one memory 1 is connected with the control input 20' of this additional switch S'.

For example, in FIG. 5 the memories 1 allocated to the outputs . . . $A_{n-2}$, $A_n$, $A_{n+2}$ . . . represent every second memory, whose other memory terminal $\overline{Q}$ is connected with a terminal 10 for the application of the clock signal $\phi$. The other memory terminal $\overline{Q}$ of each memory 1 arranged between two adjacent next-but-one memories 1 and allocated to the output $A_{n-1}$, $A_{n+1}$ or $A_{n+3}$ is connected only with the output $\overline{A}_{n-1}$, $\overline{A}_{n+1}$ or, respectively, $\overline{A}_{n+3}$. The determined memory terminal Q of the memory 1 allocated to the output $A_{n-1}$, $A_{n+1}$ or, respectively, $A_{n+3}$ is connected with the control input 20 of the switch S connected with the determined memory output Q of the adjacent next-but-one memory 1 allocated to the output $A_{n-2}$ or, respectively, $A_n$ or, respectively, $A_{n+2}$, and with the control input 20 of the switch S connected with the other memory output $\overline{Q}$ of the other adjacent next-but-one memory 1 allocated to the output $A_n$ or, respectively, $A_{n+2}$ or, respectively, $A_{n+4}$ (not shown), etc. A respective additional switch S' with a respective control input 20' for the application of a switching impulse for the optional closing and/or blocking of the additional switch S' and with a control characteristic complementary to a switch S is connected between the control input 20 of the switch S connected with the determined memory output Q of the next-but-one memory 1 allocated to the output $A_{n-2}$, $A_n$ or, respectively, $A_{n+2}$ and the terminal 10 for the application of the clock signal $\phi$, whereby the other memory terminal $\overline{Q}$ of this next-but-one memory 1 is connected with the control input 20' of this additional switch S'.

In the circuit according to FIG. 5, each modification of the clock signal $\phi$ effects a change of the state "1." Given a change from level L to level H, there thereby results a takeover of the state "1" by an output $A_{n+k}$ with odd k, e.g. by $A_{n\pm1}$, $A_{n\pm3}$, $A_{n\pm5}$, etc. In the case of a change of the signal $\phi$ from level H to level L, an output $A_{n+k}$ with even k is set to the state "1." In the circuit according to FIG. 5, the operation with only one clock signal $\phi$ is thus achieved by exploiting both possible level changes of the clock signal $\phi$. The consequence of this is that the memory 1 immediately adjacent to a memory 1 must be constructed differently than the one memory 1 itself, while the next-but-one memories 1 have the same construction among one another, and all memories 1 arranged between two respective adjacent next-but-one memories 1 again have the same construction among one another.

In the following, the manner of functioning of the circuit according to FIG. 5 is explained in more detail. Let it be assumed again that this circuit is at first in a static state, in which the output $A_n$ is in the state "1," and all other outputs are in the state "0." According to this initial state, as well as to the above-assumed convention concerning the characteristics of the switches S and additional switches S', exactly two switches S are closed, namely the switch S connected between the output $A_{n-1}$ and the reference potential $V_{SS}$, and the switch S connected between the output $A_{n+1}$ and the reference potential $V_{SS}$. Let the clock signal $\phi$ be at the level L. Correspondingly, in this state the two closed switches S are without current, i.e. the circuit is in a static idle state. A change of the state "1" to the output $A_{n+1}$ takes place by modifying the signal $\phi$ to the level H, whereby this output $A_{n+1}$ changes to the level H via the additional switch S', which is closed, connected between the output $A_{n+1}$ and the terminal 10 for the application of the clock signal $\phi$. The level H to be set at the output $A_{n+1}$ closes the switch S connected between the output $A_n$ and the reference potential $V_{SS}$, i.e. the output $A_n$ is reset to the state "0." The circuit is again in a static state with . . . =$A_{n-2}$=$A_{n-1}$=$A_n$=$A_{n+2}$=$A_{n+3}$= . . . ="0" and $A_{n+1}$="1" and . . . =$\overline{A}_{n-2}$=$\overline{A}_{n-1}$=$\overline{A}_n$=$\overline{A}_{n+2}$= . . . ="1" and $\overline{A}_{n+1}$="0," as well as $\phi$="1."

A new change of the state "1" to the output $A_{n+2}$ results when the clock signal $\phi$ is again lowered to the state "0." The setting process of the output $A_{n+2}$ and the resetting process of the output $A_{n+1}$ thereby takes place in a manner completely analogous to the principle used in the circuit according to FIG. 1.

Figure 5A:
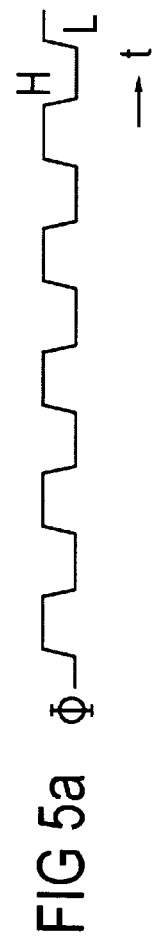
FIG. 5a shows the clock scheme for the shift action to be applied to the circuit according to FIG. 5, which effects the displacement of the determined one logical state of the selected output.

An example for a clock signal $\phi$ that can be used for the operation of the circuit according to FIG. 5 is shown in FIG. 5a in a chronological curve.

In the circuit according to FIG. 6, each controllable switch S individually allocated to a memory 1, which switch is connected with the determined memory terminal Q of this memory 1, is connected with a terminal for the application of a determined reference potential $V_{SS}$. Each controllable switch S individually allocated to a memory 1, which switch is connected with the other memory terminal $\overline{Q}$ of this memory 1, is connected with a terminal for the application of a reference potential $V_{SS}$.

Between the control input 20 of the switch S connected with the other memory output $\overline{Q}$ of each memory 1 and a terminal 10 or 10' for the application of a clock signal $\phi_1$ or $\phi_2$, there is respectively connected an additional switch S' allocated to this memory 1, having a respective control input 20' for the application of a switching impulse for the optional closing and/or blocking of the additional switch S' and a control characteristic complementary to a switch S, in such a way that these additional switches S' are successively connected in alternating fashion with a terminal 10 or 10' for the application of a clock signal $\phi_1$ or $\phi_2$ and with a terminal 10' or 10 for the application of a different clock signal $\phi_2$ or, respectively, $\phi_1$.

Moreover, the control input 20' of an additional memory 1 allocated to a memory 1 is connected with the other memory terminal Q of a memory 1 immediately adjacent to this memory 1.

For example, in the circuit according to FIG. 6 the additional switch S' allocated to the memory 1 with the output $A_n$ is connected with the terminal 10 for the application of the clock signal $\phi_2$, the additional switch S' allocated to the memory 1 with the output $A_{n+1}$ is connected with the terminal 10 for the application of the clock signal $\phi_1$, the additional switch S' allocated to the memory 1 with the output $A_{n+2}$ is connected with the terminal 10 for the application of the clock signal $\phi_2$. The output $\overline{A}_{n-1}$ is connected with the control input 20' of the additional switch S' allocated to the memory 1 with the output $A_n$, the output $\overline{A}_n$ is connected with the control input 20' of the additional switch S' allocated to the memory 1 with the output $A_{n+1}$, the output $\overline{A}_{n+1}$ is connected with the control input 20' of the additional switch S' allocated to the memory 1 with the output $A_{n+2}$.

For the explanation of the functioning of the circuit according to FIG. 6, let it again be assumed that this circuit is first in a static state, in which the output $A_n$ is in the state "1" and all other outputs are in the state "0." In this initial situation, at a time at which the clock signals $\phi_1$ and $\phi_2$ are both at the level L, the switch S, which connects the output $A_{n-1}$ with the reference potential $V_{SS}$, and the additional switch S', which connects the control input 20 of the switch S between the output $\overline{A}_{n+1}$ and the reference potential $V_{SS}$ with the terminal 10 for the application of the clock signal $\phi_1$, are closed. The circuit is in a static idle state.

A change of the state "1" to the output $A_{n+1}$ is achieved when the signal $\phi_1$ assumes the level H. By this means, the switch S between the output $\overline{A}_{n+1}$ and the reference potential $V_{SS}$ closes, whereupon the terminal $\overline{A}_{n+1}$ assumes the level L. Correspondingly, the datum of the output $A_{n+1}$ changes to the level H, by which means the switch S located between the output $A_n$ and the reference potential $V_{SS}$ is in turn closed. This in turn effects the resetting of the output $A_n$. After the termination of the process of the change of the state "1" to the the output $A_{n+1}$, the signal $\phi_1$ is again lowered to the level L.

A renewed change of the state "1" to the output $A_{n+2}$ results analogously, except in this case the introduction of the shift process takes place by means of activation via the clock signal $\phi_2$ instead of the clock signal $\phi_1$.

An example of clock signals $\phi_1$ and $\phi_1$ that can be used for the operation of the circuit according to FIG. 6 are shown in FIG. 6a in chronological allocation to one another.

The circuit according to FIG. 7 is a slight modification of the circuit according to FIG. 4, to the effect that in the circuit according to FIG. 7 each intermediate switch designated S1' comprises a control characteristic complementary to a switch S. Correspondingly, the control inputs 21' of these intermediate switches S1' are driven with signals that are complementary to the signals with which the intermediate switches S1 of the circuit according to FIG. 4 are driven. Thus, the principle of functioning of the circuit according to FIG. 7 is completely analogous to that of the circuit according to FIG. 4. Accordingly, a detailed specification would be superfluous. In particular, the statements concerning the function and the necessity of the additional intermediate switches hold here as well.

An example for the clock signals $\phi_1$ and $\phi_1$ that can be used for the operation of the circuit according to FIG. 7 are shown in FIG. 7a in chronological allocation to one another. These signals can be identical with the signals according to FIG. 4a.

Upon commissioning of an inventive pointer circuit, it is first required to initialize the entire circuit, i.e. to reset all outputs $A_j$, j= . . . n−2, n−1, n, n+1, n+2, n+3, . . . to the state "0." It is possible that such a resetting process can also optionally be desired during operation. In the following, various possibilities for the initialization are specified.

In the circuit according to FIG. 3, the initialization can advantageously be achieved by the application of a determined combination of the clock signals $\phi_1$, $\phi_2$, $\phi_3$ and $\phi_4$ to the terminals 10. In this combination, it is required only that at the time of initialization the clock signals $\phi_1$, $\phi_2$, $\phi_3$ and $\phi_4$ respectively assume the level H, so that at this time $\phi_1=\phi_2=\phi_3=\phi_4=H$. However, in all other circuits shown there is no such possibility.

A possibility for the initialization of the inventive pointer circuit is created when a further switch is respectively added to each memory 1 of the circuit, in addition to the shift circuit 2. In FIGS. 14a to 14d, various variants of this possibility are shown, whereby the additional switch is designated $S_R$, and the pointer circuit is shown in simplified fashion as a block switching diagram consisting of the memories 1 and the shift circuit 2.

In the variant according to FIG. 14a, the newly inserted additional switches $S_R$ are located between the outputs $A_j$, j= . . . n−1, n, n+1, . . . and the reference potential $V_{SS}$, and in the variant according to FIG. 14b they are located between the outputs $\overline{A}_j$ and a supply voltage $V_{DD}$ for the pointer circuit.

Each further switch $S_R$ has a control input 23 that is connected with a terminal 11 for the application of a reset signal RESET. A resetting of all memories 1 results in the variants according to FIGS. 14a and 14b when the signal RESET assumes the level H.

Alternatively, additional switches $S_R'$, with control characteristic complementary to the additional switches $S_R$, can also be used, as shown in FIGS. 14c and 14d. In this case, the signal RESET is however active at the level L. The control inputs of these additional switches $S_R'$ are designated 23'.

Under certain preconditions, an initialization can also be carried out via the supplying of the supply voltages $V_{DD}$. In this case, the number of additional switches $S_R$ per memory 1 remains unchanged, but several separate lines must be used for the supplying of the supply voltage $V_{DD}$ to the components inside the memory 1. During the initialization, the clock signals are respectively at the level that they also assume during the static states of the corresponding circuits.

Figure 15A:
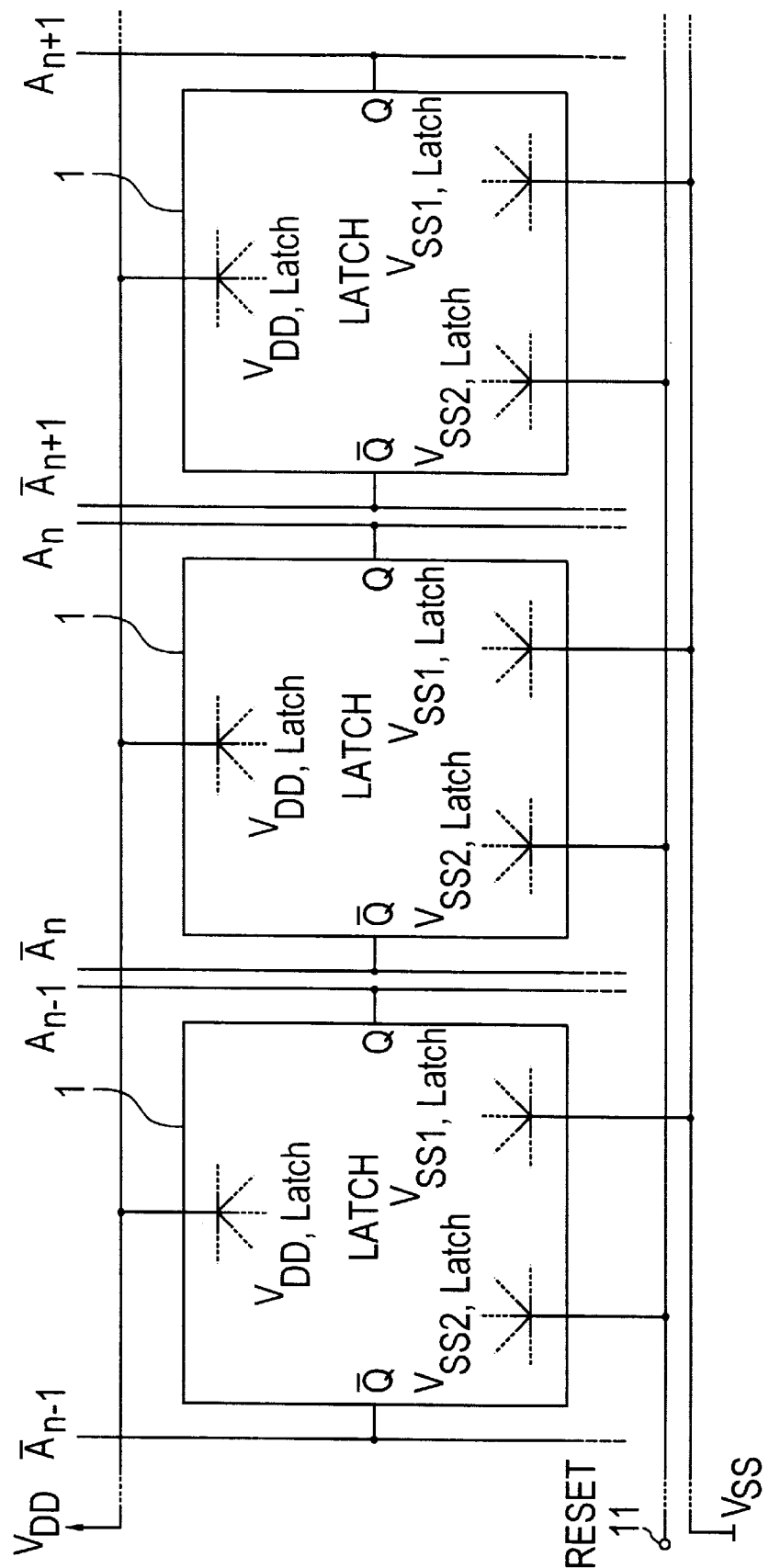
FIGS. 15a and 15b show schematic representations for the initialization of an inventive pointer circuit via the supplying of the supply voltages, whereby
Figure 15B:
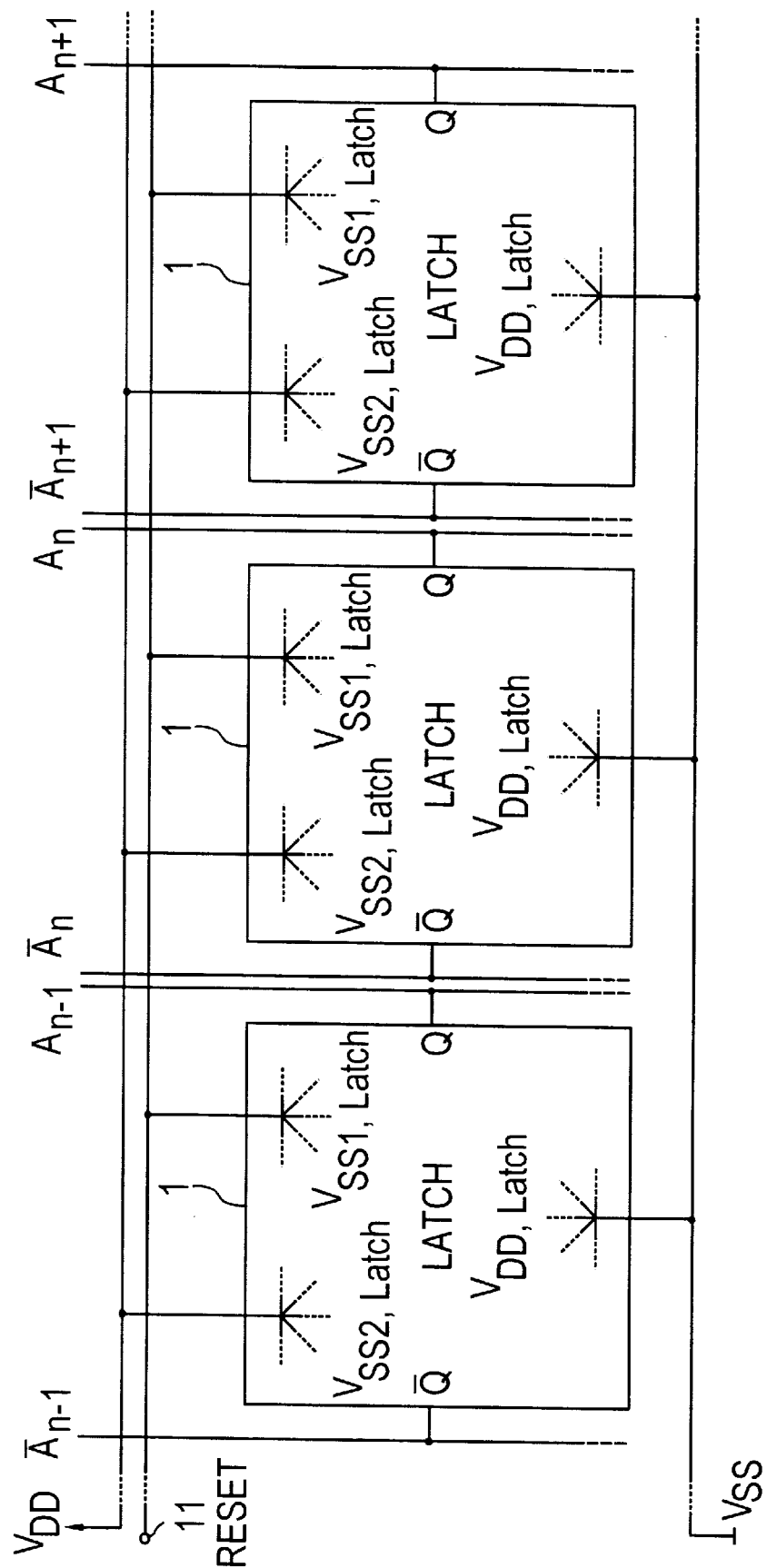

In FIGS. 15a and 15b, the method is shown in principle. The terminals of the components within a memory 1 which during normal operation are at reference potential $V_{SS}$ in the case of FIG. 15a, or, respectively, the supply voltage $V_{DD}$ in the case of FIG. 15b, are partitioned to two nodes $V_{SS1,latch}$ and $V_{SS,latch}$ (FIG. 15a) or, respectively, $V_{DD1,latch}$ and $V_{DD2,latch}$ (FIG. 15b) per memory 1. Per memory 1, there thus now exist three nodes, instead of the standard two, for the supplying of the supply voltages $V_{DD}$. A node of this sort for the supplying of the supply voltages, which exists only in single fashion (in FIG. 15a the node $V_{DD,latch}$, in FIG. 15b the node $V_{SS,latch}$) is applied directly in fixed fashion to the potential at which it is also found during normal operation. The same holds for one of the nodes constructed in twofold fashion for the supplying of the supply voltages. In FIGS. 15a and 15b, the terminal indicated with "1" is respectively used for this purpose, without limitation of generality. The signal RESET is applied directly to the remaining nodes for the supplying of the supply voltages.

During normal operation, the signal RESET must be at the reference potential $V_{SS}$ in the variant according to FIG. 15a, and must be at the potential $V_{DD}$ in the variant according to FIG. 15b. An initialization of the circuit according to FIG. 15a is achieved by means of the application of a potential $V_{DD}$, and an initialization of the circuit according to FIG. 15b is achieved by the application of a potential $V_{SS}$ at the terminal 11 for the application of the signal RESET. After the switching back at the terminal 11 for the signal RESET to the potential valid for normal operation, the level L is adjacent to all outputs $A_j$ both in the variant according to FIG. 15a and also in that according to FIG. 15b.

The applicability of these methods and the selection of which of the supply voltages is to be supplied in "split" fashion, depends on the concrete circuit-oriented construction of the memory 1 and on the level of the supply voltage. For this reason, these questions can be decided only given a concrete circuit design. In addition, this method is not limited to pointer circuits. Rather, it can be used for a much larger number of circuits in which static memories or, respectively, latches are used.

Independent of the length, i.e. the number of memories 1 of the inventive pointer circuit, a complete process for displacement of the one logical state (in the example, of the state "1") effects reload processes only in exactly two memories 1, because reload processes take place only in those memories whose initial data changes, i.e., in the memory 1 that takes over the state "1" from a preceding memory 1, as well as in the preceding memory 1. In all other memories 1, no reload processes occur at the outputs during a displacement process. In principle, this configuration leads to a very advantageous power loss balance of an inventive pointer circuit.

It is fundamentally to be emphasized that the above-assumed conventions do not represent necessary preconditions for the functioning of an inventive pointer circuit. Rather, variants of this circuit are also possible in which a different allocation of the logical states "0" and "1" to voltage levels is carried out and in which the setting or, respectively, resetting of the memories 1 takes place not via the level L, but rather via the level H. Correspondingly, in these cases other clock schemata can be required with respect to the level, whereby, however, the chronological raster thereof always remains the same. It can likewise be necessary in these cases to replace the switches that, in the variants according to FIGS. 1–7, short-circuit an output or terminal to a potential $V_{SS}$ or a potential $V_{DD}$ with switches that can connect the corresponding output or terminal to a potential $V_{DD}$ or, respectively, potential $V_{SS}$, or else to replace H-active switches with L-active ones, and vice versa.

FIGS. 8–13 respectively show a concrete realization of the circuits according to FIGS. 1–3 and 5–7 in CMOS technology.

Figure 8:
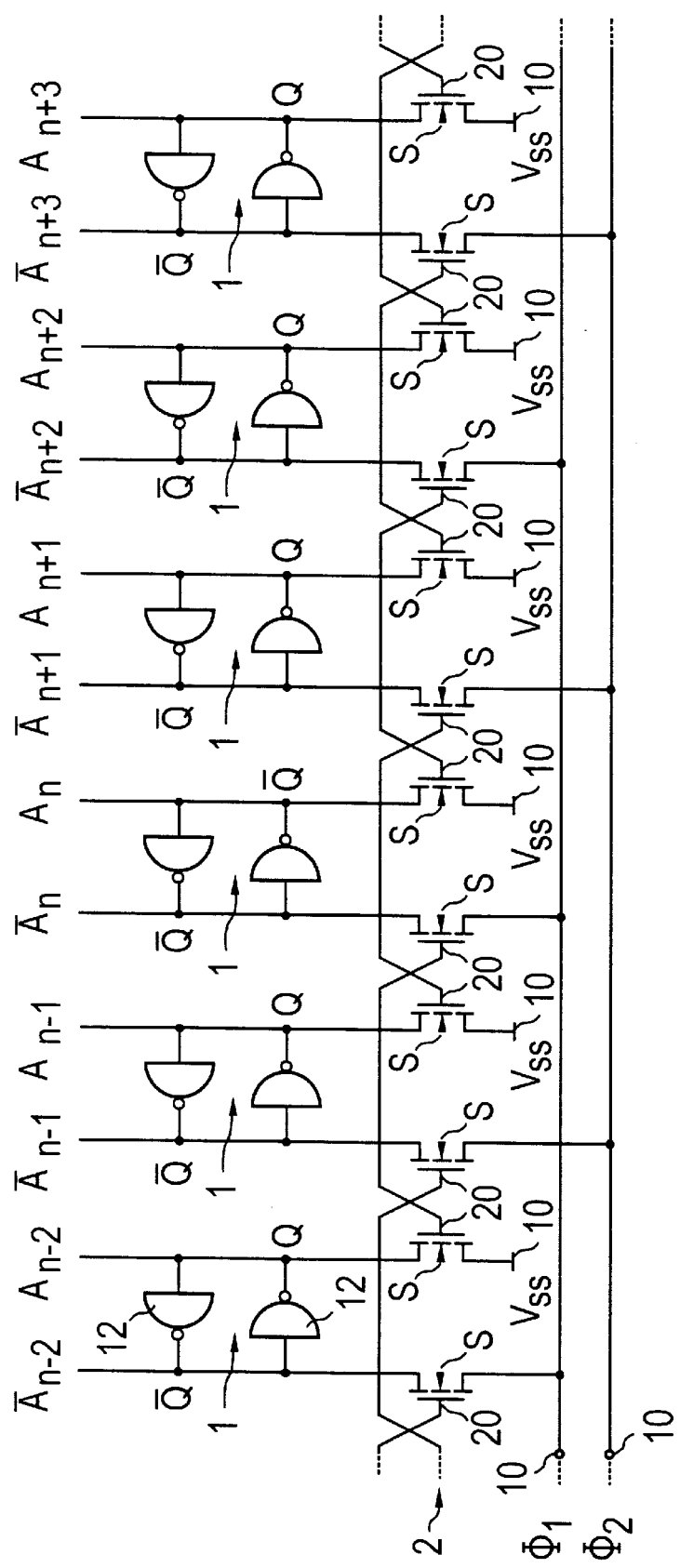
FIG. 8 shows a construction of the first variant according to FIG. 1 of the inventive pointer circuit in CMOS technology.
Figure 9:
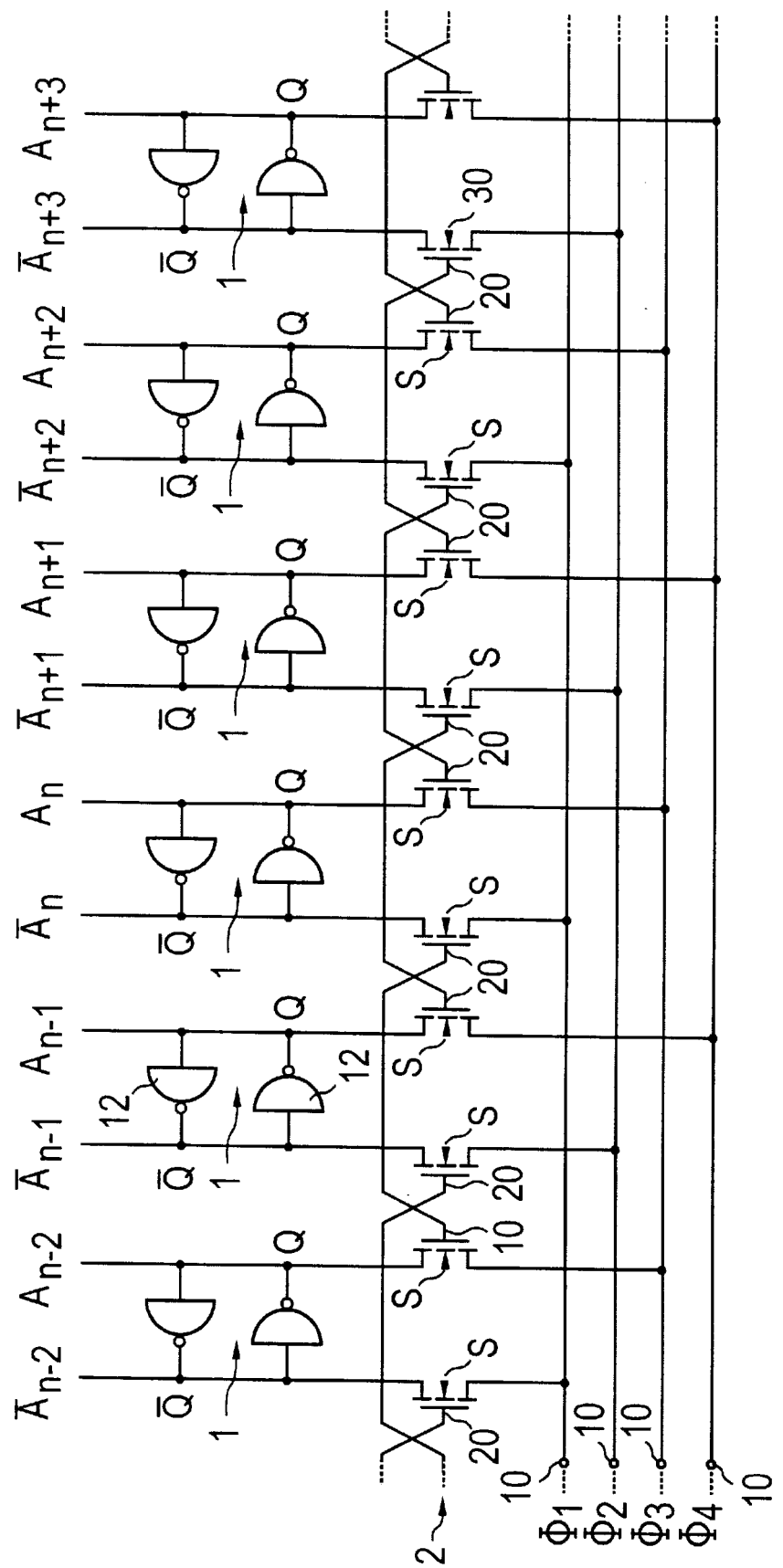
FIG. 9 shows a construction of the second variant according to FIG. 2 of the inventive pointer circuit in CMOS technology.
Figure 10:
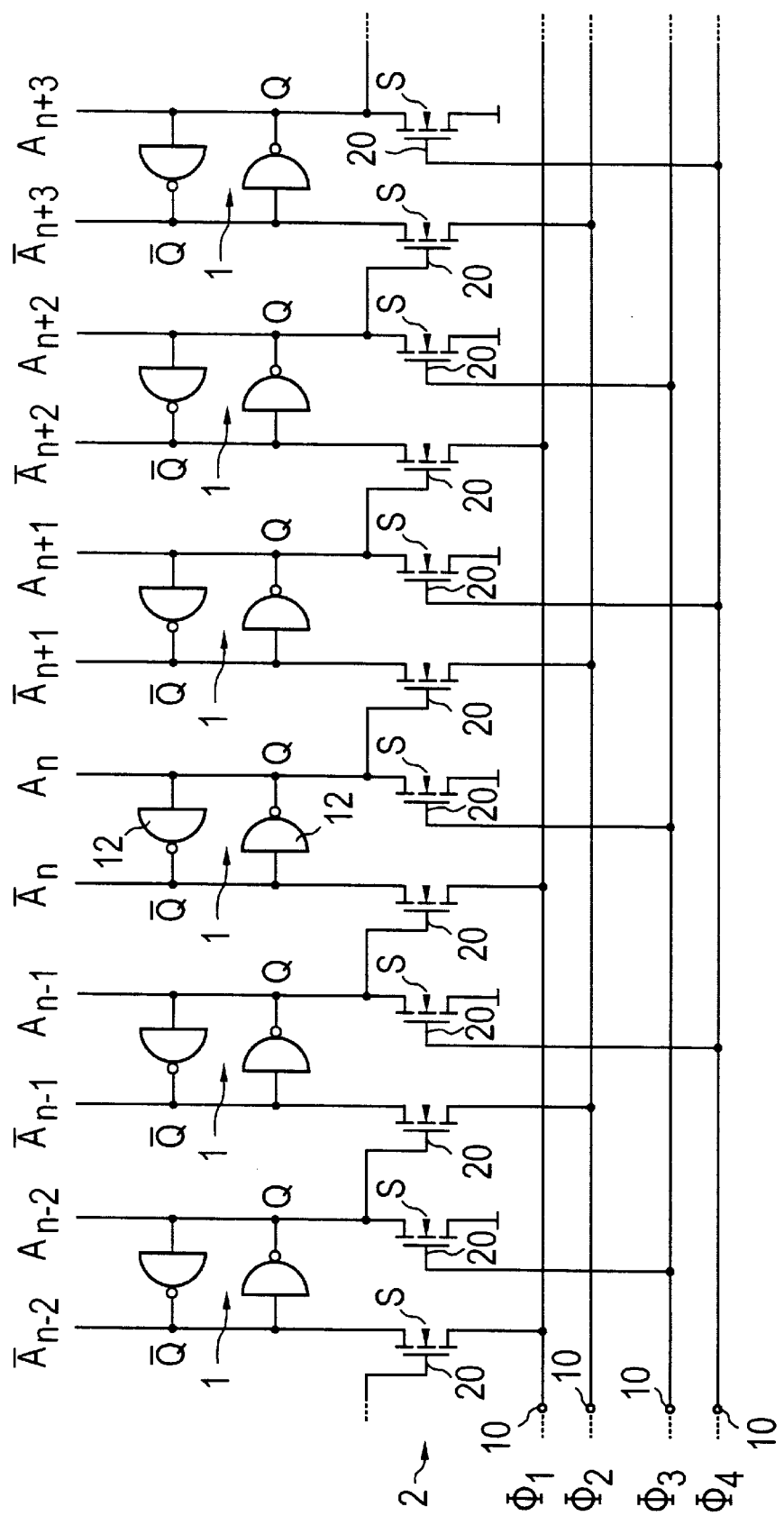
FIG. 10 shows a construction of the third variant according to FIG. 3 of the inventive pointer circuit in CMOS technology.
Figure 11:
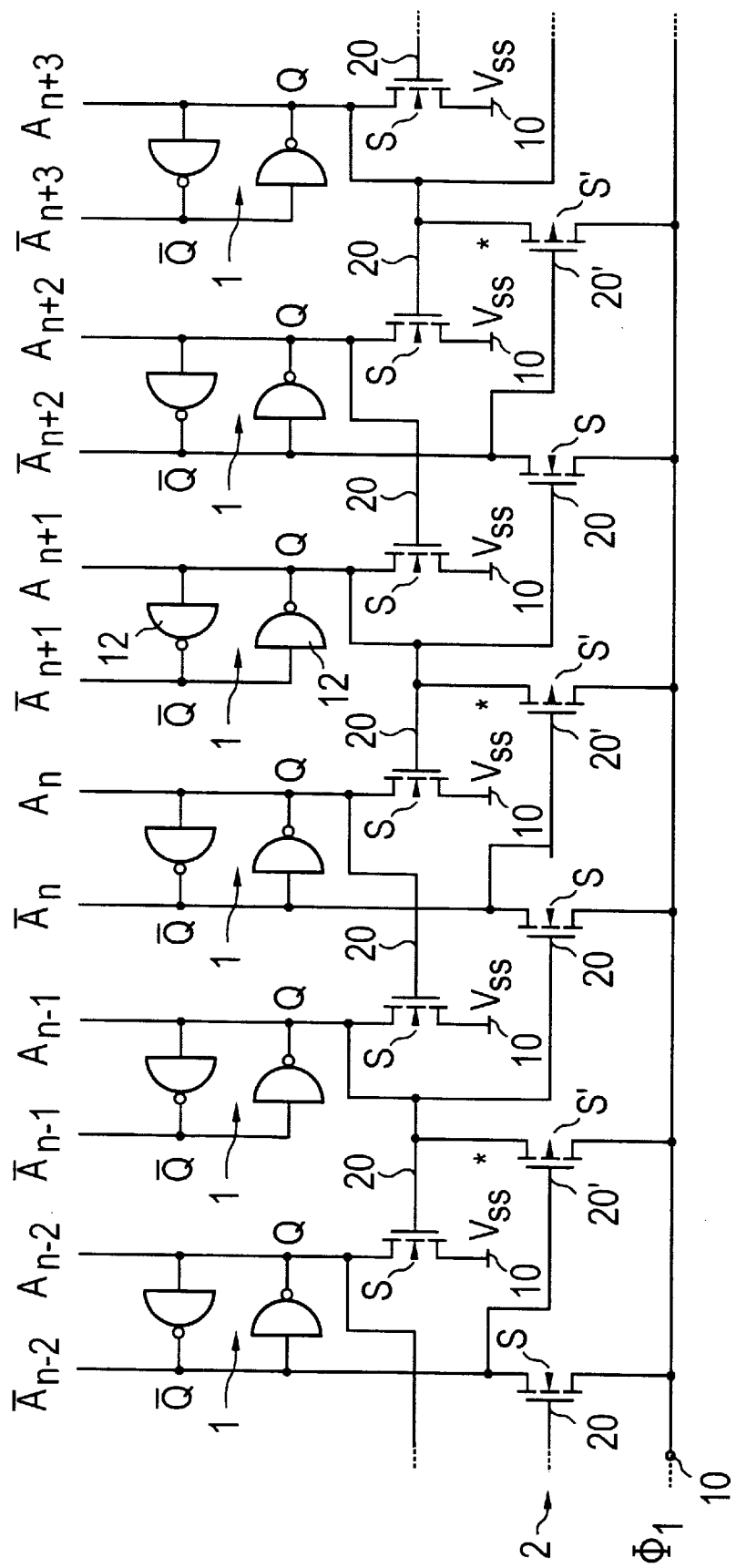
FIG. 11 shows a construction of the fifth variant according to FIG. 5 of the inventive pointer circuit in CMOS technology.
Figure 12:
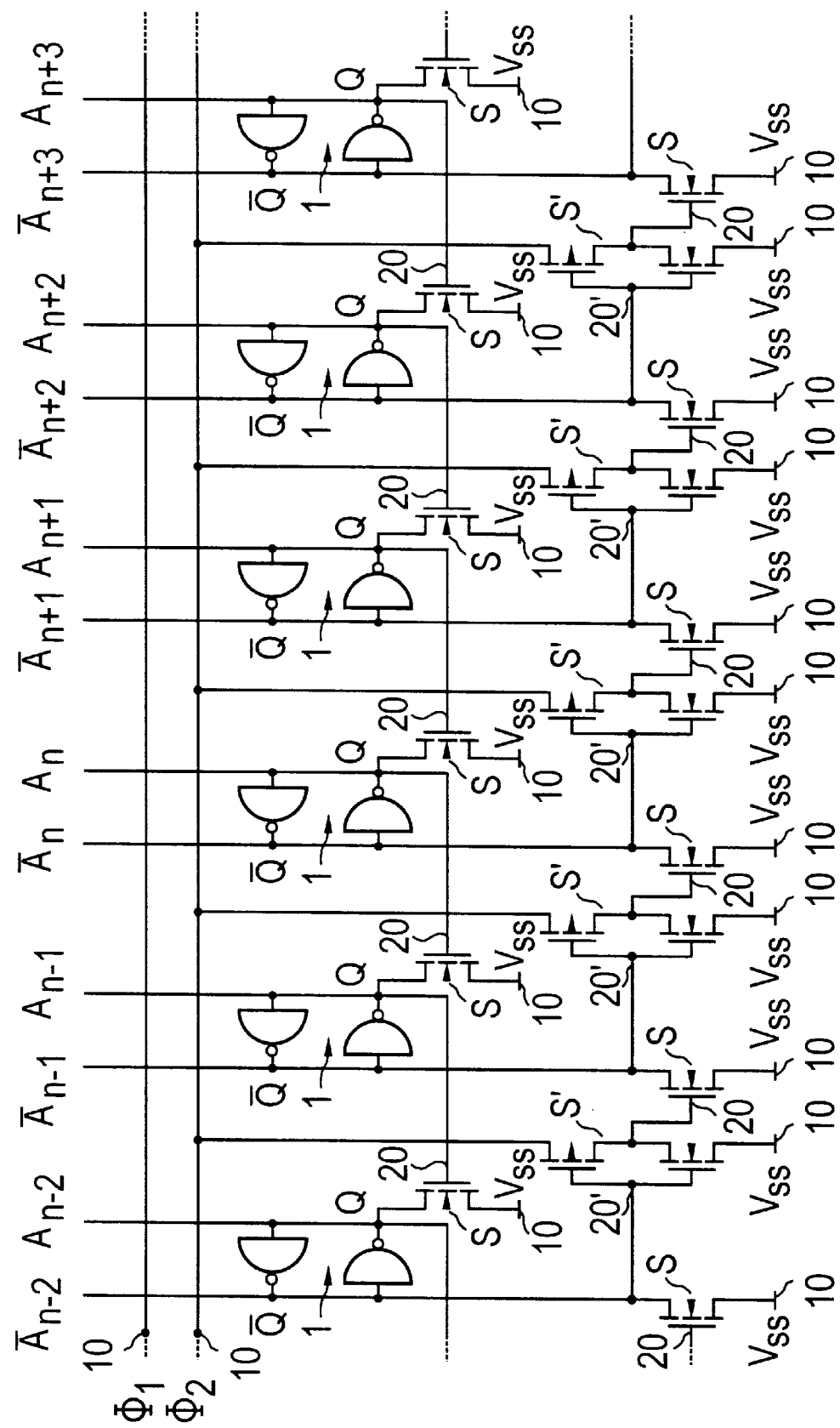
FIG. 12 shows a construction of the sixth variant according to FIG. 6 of the inventive pointer circuit in CMOS technology.
Figure 13:
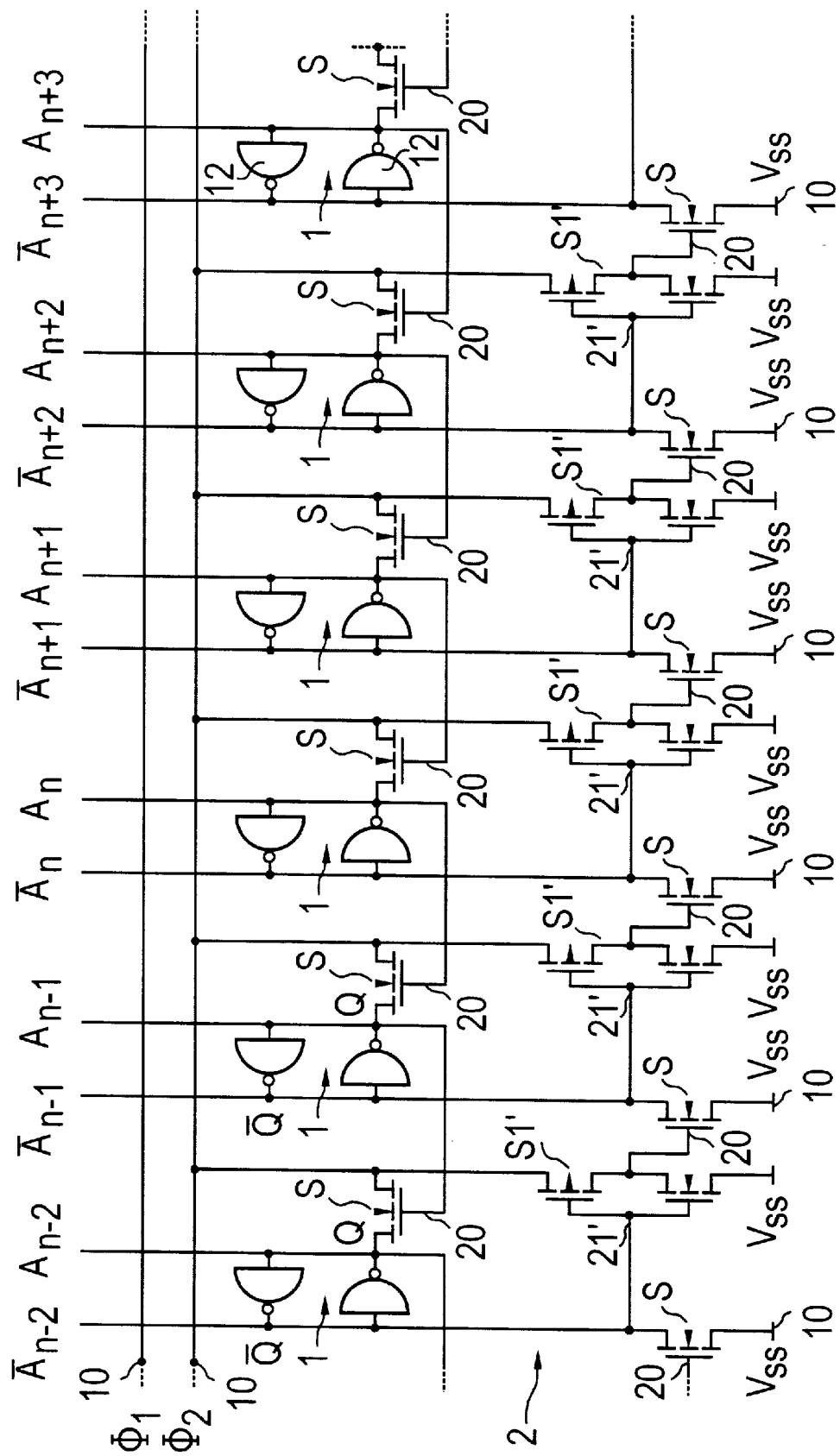
FIG. 13 shows a construction of the seventh variant according to FIG. 7 of the inventive pointer circuit in CMOS technology.

FIG. 8 shows the realization of the circuit according to FIG. 1, FIG. 9 shows the realization of the circuit according to FIG. 2, FIG. 10 shows the realization of the circuit according to FIG. 3, FIG. 11 shows the realization of the circuit according to FIG. 5, FIG. 12 shows the realization of the circuit according to FIG. 6, and FIG. 13 shows the realization of the circuit according to FIG. 7.

In all cases, each memory 1 consists of two positive-feedback-connected converters 12, and the switches S and intermediate switches S1, S2 are realized by n-MOS transistors, while the additional switches S' and intermediate switches S1' are realized by p-MOS transistors, whereby the gate terminals of the transistors form the control terminals 20, 21 or, respectively, 22 of the switches S, S1 or, respectively, S2 and the control terminals of the switches S' and S1'.

All transistors except the p-MOS transistors designated with an asterisk (*) in FIG. 11 have minimum dimensions, whereby the space requirement of the circuits is very low. Since the current capacity of n-MOS transistors is better by a factor of 2 to 3 than that of p-MOS transistors, and since n-MOS transistors can conduct a potential L without voltage loss, this dimensioning guarantees that an output at potential H or, respectively, memory terminal of a memory 1 can be securely inverted by means of short-circuiting to the potential L via an n-MOS transistor.

In contrast, in the realization according to FIG. 11 the setting of each next-but-one memory 1 takes place in that the relevant memory terminals of these memories 1 are connected to potential H via the p-MOS transistors marked with *. However, these transistors may not have minimum dimensions, because they must be able reliably to invert the potential L contained by a (minimum) n-MOS transistor at the memory terminal of the memory 1, and because their current capacity is smaller than that of n-MOS transistors, given the same dimensions. For this reason, these p-MOS transistors have been constructed five times broader than the other transistors.

FIG. 16a shows the circuit-oriented realization of the initialization according to FIG. 14a in an analogous representation, whereby only the memories 1 are shown as in the FIGS. 8–14, while in contrast the shift circuit 2 is shown only as a block. The resetting means is realized in that a respective n-MOS transistor is inserted as an additional switch $S_R$ between each output $A_j$, j= . . . n−2, n−1, n, n+1, n+2, n+3, . . . and the potential $V_{SS}$. It suffices to construct these transistors $S_R$ in minimum fashion with respect to their dimensions. The H-active signal RESET is applied to the gate terminals of these additional transistors, which terminals form the control terminal 23 of the additional switches $S_R$.

FIG. 16b shows the circuit-oriented realization of the initialization according to FIG. 14d in an analogous representation, whereby only the memories 1 are shown as in the FIGS. 8–14, while in contrast the shift circuit 2 is shown only as a block. Here, p-MOS transistors $S_{R'}$ are inserted between the outputs $\overline{A}_j$ and a supply potential $V_{DD}$, the gate terminals 23' of these transistors being connected with the terminal 11 for the application of the (here L-active) signal RESET. For the reasons already described in relation to FIG. 11, these transistors, also marked here with an asterisk (*) cannot however have minimum dimensions. A suitable dimensioning can be e.g. to give them five times the width of a minimum transistor.

Figure 18:
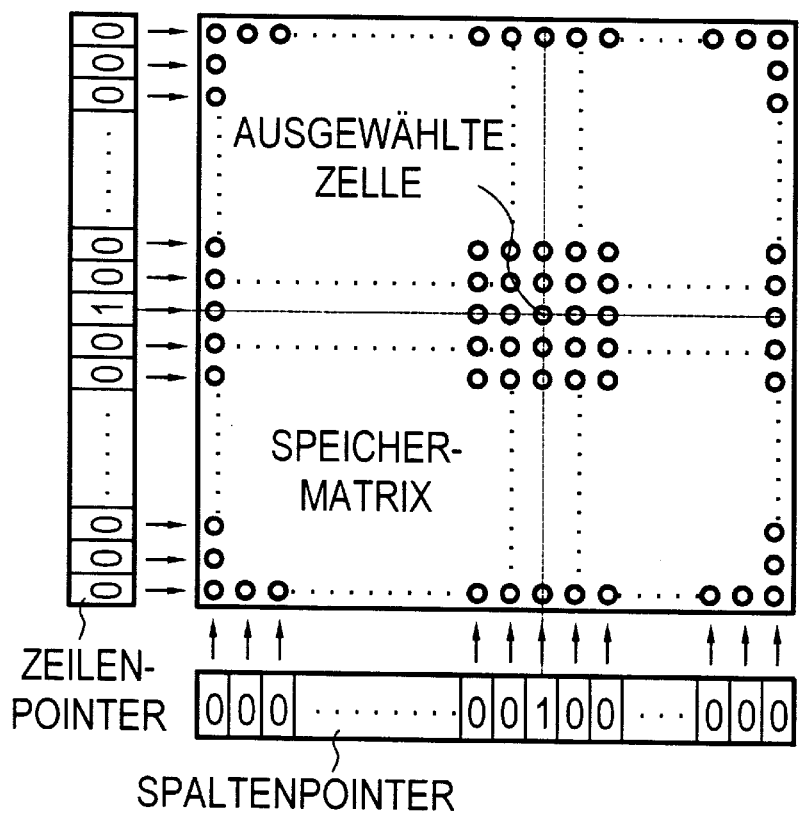
FIG. 18 shows a selection of exactly one memory cell within a memory matrix, using a column pointer and a row pointer.

FIG. 18 shows, by way of example, the selection of exactly one memory cell inside a memory matrix with the aid of a column pointer and a row pointer, each of which can be realized with an inventive pointer circuit.

Figure 19A:
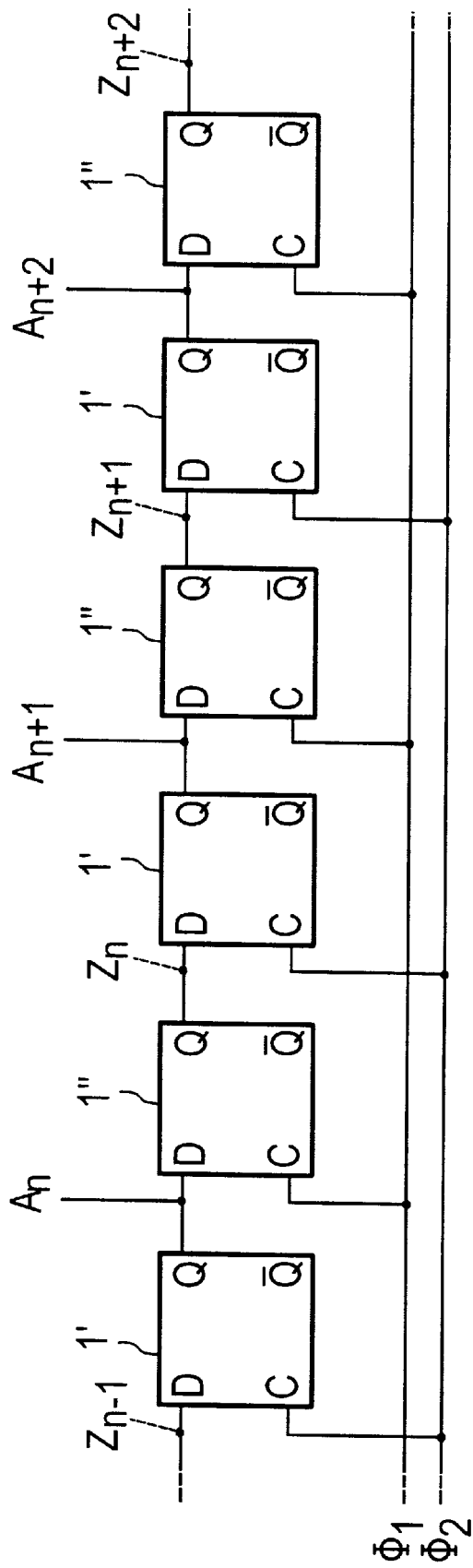
FIG. 19a shows the construction of a conventional master-slave shift register with D-flip-flops.
Figure 19B:
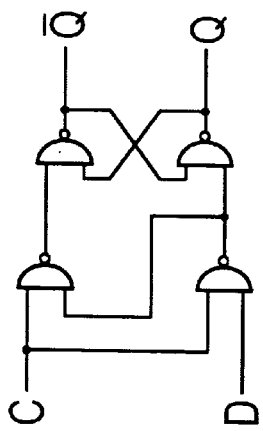
FIG. 19b shows an example for the construction of a D-flip-flop with the aid of four NAND gates.

FIG. 19 shows an example of a pointer circuit in the form of a conventional master-slave shift register made of D-flip-flops. Signals . . . $Z_n$, $Z_{n+1}$, $Z_{n+2}$, . . . are adjacent to outputs of the intermediate memories 1". The actual outputs . . . $A_n$, $A_{n+1}$, $A_{n+2}$ . . . of the shift register are respectively located at an output Q of a main memory 1'. With the clock signal $\phi_1$, here the datum of the outputs . . . $A_n$, $A_{n+1}$, $A_{n+2}$ . . . of the main memories 1' is transferred into the intermediate memory 1", so that then $Z_n=A_{n+1}$, . . . After the inputs of the intermediate memories 1" have again been locked by the clock signal $\phi_1$, the data of the intermediate memories 1" can by means of activation of the inputs C of the main memories 1' have again been locked with the clock signal $\phi_1$, the data of the inputs C of the main memories 1' can be incorporated into the following main memory stage and intermediate memory stage with the clock signal $\phi_2$, so that now $A_n=Z_{n1}$, $A_{n+1}=Z_n$, $A_{n+2}=Z_{n+1}$, . . .

FIG. 19a shows an example for the construction of a D-flip-flop made of four NAND gates (see U. Tietze, Ch. Schenk, "Halbleiter-Schaltungstechnik," Springer Verlag, 9th Edition, 1990.

In FIG. 20, as a further example a pointer circuit is shown in the form of a different conventional master-slave shift register. Signals $Z_n$ are adjacent to outputs of intermediate memories 1". The actual outputs . . . $A_n$, $A_{n+1}$, $A_{n+2}$ . . . of the shift register are respectively located at an output Q of a main memory 1'. The data transfer of the outputs . . . $A_n$, $A_{n+1}$, $A_{n+1}$ . . . of the main memories 1' into the intermediate memories 1" hereby takes place by the closing of switches $S_{AZ,n}$, $S_{AZ,n+1}$, . . . , and the transfer from the intermediate memories 1" into the subsequent main and intermediate memory stages takes place by closing the switches $S_{ZA,n}$, $S_{ZA,n+1}$ . . .

Figure 21:
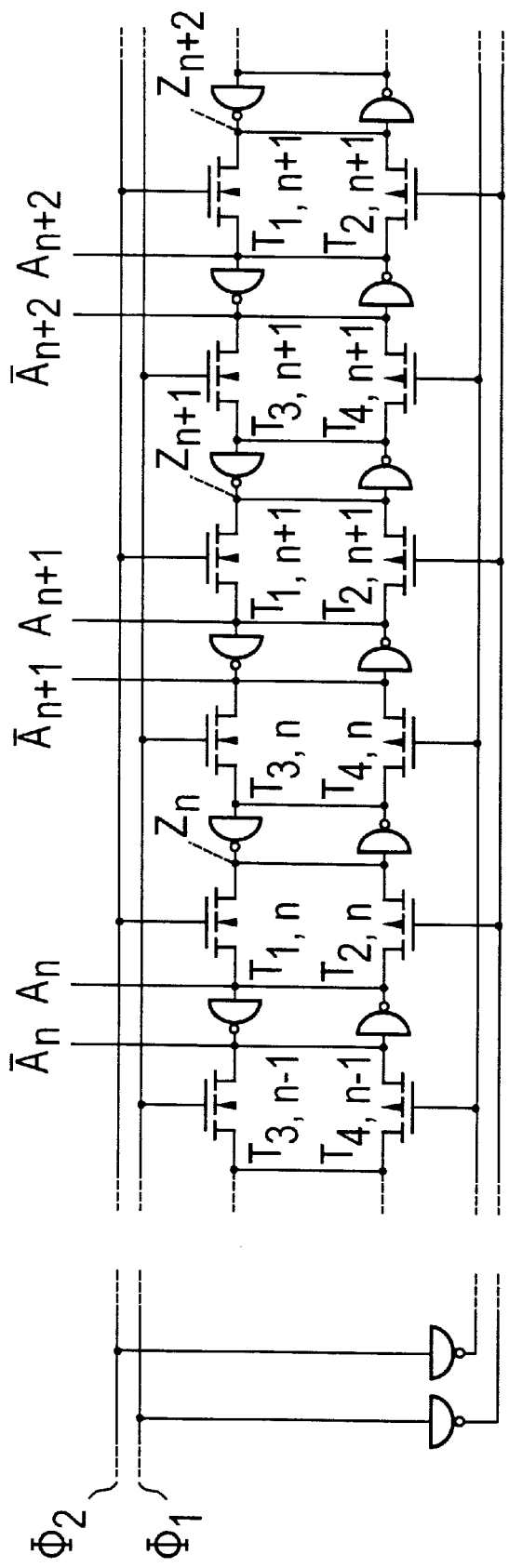
FIG. 21 shows an example of the construction of the master-slave shift register according to FIG. 20 in CMOS technology.

FIG. 21 shows a possible realization of the pointer circuit according to FIG. 20 in CMOS technology (see N. H. E. Weste, K. Eshraghian, "Principles of CMOS VLSI Design," Addison-Wesley Publishing Company, 1993)), whereby the switches $S_{AZ}$ consist of transfer gates $T_{1,n}$, $T_{2,n}$, $T_{3,n}$, $T_{4,n}$, $T_{1,n+1}$, $T_{2,n+1}$, $T_{3,n+1}$, $T_{4,n+1}$, . . . of which each is formed by an n-channel transistor and a p-channel transistor. The memories 1' and 1" are constructed respectively from two inverters connected in positive feedback fashion.

In the circuit according to FIG. 21, an inversion of the signal respectively takes place after each memory. This inversion of the signal after each main and intermediate memory stage was not incorporated into FIG. 21 because it is not essential for the description of the principle of this circuit.

Independent of the technology used, all these previously known pointer circuits require a relatively high number of components per pointer output. This relatively high space requirement can have a very disadvantageous effect in particular in applications according to FIG. 17, because the row and column terminals in particular technologies or, respectively, in particular variant architectures of the cell field have very small spacings.

Differing from the conventional pointer circuits according to FIGS. 19–21, an inventive pointer circuit does not require any intermediate memories. This means that in an inventive pointer circuit only precisely one memory 1 is required per output $A_j$, j=1, 2, ... n−2, n−1, n, n+1, n+2, ... The outlay of components required is thereby reduced considerably, leading to a substantially lower space requirement in relation to conventional pointer circuits. This is e.g. unavoidable if, as shown in FIG. 17, these circuits are used for the selection of a memory cell within a memory matrix, and the row lines or, respectively, column lines have very small spacings (see [1]).

In contrast to pointer circuits previously known in the form of shift registers, an inventive pointer circuit cannot shift arbitrary data chains. Rather, the logical state at the output $A_{j-1}$ and $A_{j+1}$ of the memories 1 immediately adjacent to the memory 1 whose output $A_j$ comprises the one logical state, e.g. "1," must always be the other logical state, e.g. "0." This means that the condition $A_j$="1" implies $A_{j-1}=A_{j+1}$="0." This condition is however necessarily required anyway for the operation of a circuit as a pointer.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A pointer circuit with a predetermined number of outputs and for selecting one output such that the one output alone is in a determined one logical state of two logically distinguishable states, while all other outputs are in the other logical state and are not selected, and for changing the one logical state from the one output to an output immediately adjacent to this output in response to inputting a clock signal, so that after this change the immediately adjacent output is in the one logical state and is the selected output, while all other outputs, are in the other logical state and are not selected, comprising:

a plurality of static memories, each of said static memories having first and second memory terminals, the plurality of static memories being respectively associated with the number of outputs, each of said memories respectively having the first and second memory terminals complementary to one another, such that the terminals are always in first and second stored logical states that are different from one another;

a respective static memory of said plurality of static memories having a predetermined memory terminal connected with a respective output that is associated with the respective static memory;

a shift circuit connected with the predetermined memory terminal of each memory for producing a logical state at the predetermined memory terminal of a memory and for changing the logical state from the predetermined memory terminal of a first memory to a predetermined memory terminal of a second memory immediately adjacent to the first memory by inputting at least one clock signal, which simultaneously effect the change such that the predetermined memory terminal of one respective memory is in one of the first and second logical states, and such that the predetermined memory terminals of all other memories are in the other of the first and second logical states.

2. The circuit according to claim 1, wherein the shift circuit comprises for each respective memory:

a controllable switch, which is connected between a first memory terminal of the respective memory and a reference terminal for applying a reference potential;

the first controllable switch having a control input for applying a switching signal for closing and/or opening the first controllable switch;

a second controllable switch, which is connected between the second memory terminal of the respective memory and a terminal for applying a control potential;

the second controllable switch having a control input for applying a switching signal for closing and/or opening the second controllable switch.

3. The circuit according to claim 2, wherein:

each first controllable switch is individually allocated to a respective memory, which first controllable switch is connected with the first memory terminal of the respective memory, and is connected with a terminal for applying a potential;

each second controllable switch is individually allocated to a respective memory, which second controllable switch is connected with the second memory terminal of the respective memory, and is connected with a terminal for applying a clock signal, such that these switches are connected successively in alternating fashion with a terminal for the application of a clock signal and with a terminal for the application of another clock signal; and the predetermined memory terminal of a respective memory is connected to the control input of a switch that is allocated to a memory immediately adjacent to the respective memory and is connected with the predetermined memory terminal of the immediately adjacent memory, and to the control input of a switch that is allocated to a another memory immediately adjacent to the one memory and is connected with the other memory terminal of this immediately adjacent other memory.

4. The circuit according to claim 3, wherein each controllable switch individually allocated to a respective memory, which switch is connected with the predetermined memory terminal of the respective memory, is connected with a terminal for the applying of a reference potential.

5. The circuit according to claim 3, wherein each controllable switch individually allocated to a respective memory, which switch is connected with the predetermined memory terminal of the respective memory, is connected with a terminal for applying an additional clock signal, such that these switches are connected successively in alternating fashion with a terminal for applying a further clock signal and with a terminal for applying a different additional clock signal.

6. The circuit according to claim 2, wherein:

each first controllable switch is associated with a respective memory, which first controllable switch is connected with the first memory terminal of the respective memory, and is connected with a terminal for applying a potential;

each second controllable switch is respectively associated with a respective memory, which second controllable switch is connected with the second memory terminal of the respective memory, and is connected with a terminal for applying a clock signal, such that these switches are connected successively in alternating fashion with a terminal for the application of a clock signal and with a terminal for the application of another clock signal;

the predetermined memory terminal of a respective memory is connected to the control input of a switch that is associated with a memory immediately adjacent to the respective memory and is connected with the predetermined memory terminal of the immediately adjacent memory, and to the control input of a switch that is associated with a another memory immediately adjacent to the one memory and is connected with the other memory terminal of this immediately adjacent other memory;

the predetermined memory terminal of a respective memory is connected to the control input of a switch that is associated with a memory immediately adjacent to the respective memory and is connected with the other memory terminal of this immediately adjacent memory;

the control input of each switch is connected with a terminal for applying an additional clock signal such that the control inputs of the switches are connected successively in alternating fashion with a terminal for applying an additional clock signal and with a terminal for applying another additional clock signal.

7. The circuit according to claim 2, wherein:

each first controllable switch is respectively associated with a respective memory, which first controllable switch is connected with the first memory terminal of the respective memory, and is connected with a terminal for applying a potential;

each second controllable switch is respectively associated with a respective memory, which second controllable switch is connected with the second memory terminal of the respective memory, and is connected with a terminal for applying a clock signal, such that these switches are connected successively in alternating fashion with a terminal for the application of a clock signal and with a terminal for the application of another clock signal;

the predetermined memory terminal of a respective memory is connected to the control input of a switch that is associated with a memory immediately adjacent to the respective memory and is connected with the predetermined memory terminal of the immediately adjacent memory, and to the control input of a switch that is allocated to a another memory immediately adjacent to the one memory and is connected with the other memory terminal of this immediately adjacent other memory;

each second controllable switch is associated with a respective memory, which second controllable switch is connected with the second memory terminal of the respective memory, and is connected with a terminal for applying a determined reference potential;

a terminal for applying a clock signal, with which is connected a predetermined controllable switch connected with the predetermined memory terminal of the respective memory, is connected via a controllable intermediate switch with the control terminal of the other memory terminal of a memory immediately adjacent to the respective memory; and the predetermined memory terminal of a respective memory is connected with the control terminal of the terminal for applying a clock signal, with which is connected the controllable switch connected with the predetermined memory terminal of the respective memory, and the intermediate switches connected with the other memory terminal of the memory immediately adjacent to the respective memory, and is connected with the control terminal of the switch connected with the predetermined memory terminal of another memory immediately adjacent to the respective memory.

8. The circuit according to claim 7, wherein each of the intermediate switches has a control characteristic complementary to the predetermined switch.

9. The circuit according to claim 7, wherein the other memory terminal of a respective memory is connected with a control input of a further intermediate switch that is connected between the control terminal and the other memory terminal of a memory immediately adjacent to the respective memory.

10. The circuit according to claim 2, wherein:

each second controllable switch respectively associated with a respective memory, which switch is connected with the predetermined memory terminal of the respective memory, is connected with a terminal for applying a reference potential;

a respective controllable switch is respectively associated with every second memory in a series of memories, which switch is connected with the other memory terminal of a next-but-one memory, and is connected with a terminal for applying of a clock signal;

the predetermined memory terminal of each memory located between two adjacent next-but-one memories is connected with the control input of the switch connected with the predetermined memory output of an adjacent next-but-one memory and with the control input of the switch connected with the other memory output of the other adjacent next-but-one memory; and a respective additional switch with a respective control input for applying a switching impulse for closing and/or opening of the additional switch and with a control characteristic complementary to a respective switch is connected between the control input of the switch connected with the predetermined memory output of each next-but-one memory and a terminal for applying the clock signal, whereby the other memory terminal of the next-but-one memory is connected with the control input of the additional switch.

11. The circuit according to claim 2, wherein:

each first controllable switch respectively associated with a respective memory, which switch is connected with the predetermined memory terminal of the respective memory, is connected with a terminal for applying a predetermined reference potential;

each second controllable switch is respectively associated with a memory, which switch is connected with the other memory terminal of the respective memory, is connected with a terminal for applying the predetermined reference potential;

an additional switch is connected between the control input of the switch connected with the other memory output of each memory and a terminal for applying a clock signal, with a respective control input for applying a switching impulse for closing and/or opening of the additional switch and with a control characteristic complementary to the respective switch, such that these additional switches are successively connected in alternating fashion with a terminal for applying a clock signal and with a terminal for applying another clock signal; and the control input of an additional memory allocated to a memory is connected with the other memory terminal of a memory immediately adjacent to the respective memory.

* * * * *